(12) United States Patent
Kwon et al.

(10) Patent No.: US 9,640,690 B2
(45) Date of Patent: May 2, 2017

(54) MULTILAYER FILM AND MANUFACTURING METHOD THEREOF

(71) Applicant: LG CHEM, LTD., Seoul (KR)

(72) Inventors: Yoon Kyung Kwon, Daejeon (KR);
Hyun Cheol Kim, Daejeon (KR);
Hyun Seong Ko, Seoul (KR)

(73) Assignee: LG Chem, Ltd., Seoul (KR)

( * ) Notice: Subject to any disclaimer, the term of this patent is extended or adjusted under 35 U.S.C. 154(b) by 213 days.

(21) Appl. No.: 14/243,527

(22) Filed: Apr. 2, 2014

(65) Prior Publication Data

US 2014/0209153 A1 Jul. 31, 2014

Related U.S. Application Data

(63) Continuation-in-part of application No. PCT/KR2012/008621, filed on Oct. 19, 2012.

(30) Foreign Application Priority Data

Oct. 21, 2011 (KR) .................. 10-2011-0108022
Oct. 19, 2012 (KR) .................. 10-2012-0116629

(51) Int. Cl.
*H01L 31/048* (2014.01)
*C08J 7/04* (2006.01)
*H01L 31/049* (2014.01)

(52) U.S. Cl.
CPC .......... *H01L 31/0487* (2013.01); *C08J 7/042* (2013.01); *H01L 31/049* (2014.12); *C08J 2327/12* (2013.01); *Y02E 10/50* (2013.01)

(58) Field of Classification Search
CPC ..... C08J 7/042; C08J 2327/12; H01L 31/049; H01L 31/0487; Y02E 10/50
See application file for complete search history.

(56) References Cited

U.S. PATENT DOCUMENTS

2007/0154704 A1* 7/2007 Debergalis ............... C08J 7/047
428/323
2008/0053512 A1* 3/2008 Kawashima ...... B32B 17/10018
136/244

(Continued)

FOREIGN PATENT DOCUMENTS

EP 2567813 A2 3/2013
EP 2669084 A2 12/2013

(Continued)

*Primary Examiner* — Matthew Martin
(74) *Attorney, Agent, or Firm* — Dentons US LLP

(57) ABSTRACT

Provided are a multi-layered film, a backsheet for a photovoltaic cell, a method of forming the same and a photovoltaic module. The multi-layered film may include a primer layer and a fluoropolymer coating layer formed by coating, and thus the fluoropolymer coating layer, which is a surface layer, may have excellent durability and weather resistance due to an inter-diffusion effect between materials in the respective layers, and a high interface adhesive strength with a substrate and the primer layer. In addition, in the preparation of the multi-layered film, a production cost may be reduced, productivity may be increased, and degradation in quality of a product caused by thermal transformation or heat shock may be prevented. The multi-layered film may be effectively used as a backsheet for various photovoltaic modules.

28 Claims, 12 Drawing Sheets

(56) References Cited

U.S. PATENT DOCUMENTS

| | | | | |
|---|---|---|---|---|
| 2008/0185035 A1* | 8/2008 | Hayes | ............... | B32B 17/10036 |
| | | | | 136/251 |
| 2012/0031475 A1 | 2/2012 | Kim et al. | | |
| 2012/0073632 A1* | 3/2012 | Kosar | ............... | B32B 17/10018 |
| | | | | 136/251 |

FOREIGN PATENT DOCUMENTS

| | | | |
|---|---|---|---|
| JP | 3-112333 A | 5/1991 | |
| JP | 10193513 | 7/1998 | |
| JP | 2012-164781 A | 8/2012 | |
| KR | 1020080081087 A | 9/2008 | |
| KR | 1020090094039 A | 9/2009 | |
| KR | 1020100012030 A | 2/2010 | |
| KR | 1020100015554 A | 2/2010 | |
| KR | 1020100111975 A | 10/2010 | |
| KR | 1020110049170 A | 5/2011 | |
| WO | 2007/079246 A2 | 7/2007 | |
| WO | 2010-107282 A2 | 9/2010 | |

* cited by examiner

MULTILAYER FILM AND MANUFACTURING METHOD THEREOF

CROSS-REFERENCE TO RELATED APPLICATION

This application is a bypass continuation application of International Application No. PCT/KR2012/008621, filed on Oct. 19, 2012, which claims priority to and the benefit of Korean Patent Application No. 10-2011-0108022, filed Oct. 21, 2011 and Korean Patent Application No. 10-2012-0116629, filed Oct. 19, 2012, the disclosures of which are incorporated herein by reference in their entirety.

BACKGROUND

1. Field of the Invention

The present application relates to a multi-layered film, a method of forming the same, a backsheet for a photovoltaic cell and a photovoltaic module.

2. Discussion of Related Art

Recently, there are growing concerns on renewable and clean energy because of global environment problems and exhaustion of fossil fuels, and among these, solar energy has attracted attention as a representative pollution-free energy source which can resolve problems of environmental pollution and exhaustion of the fossil fuels.

A photovoltaic cell to which a principle of generating solar power is applied is a device for converting solar light into electric energy. Since the photovoltaic cell is necessarily exposed to an external environment for a long time to facilitate absorption of the solar light, the photovoltaic cell is formed in a unit type by performing various packaging processes to protect the cell. The unit is referred to as a photovoltaic module.

The photovoltaic module should use a backsheet having excellent weather resistance and durability to stably protect the photovoltaic cell when exposed to an external environment for a long time. The backsheet for a photovoltaic cell is in contact with ethylene vinyl acetate (EVA) used as a photovoltaic encapsulant so as to physically protect the photovoltaic cell, prevent moisture penetration into the cell and be maintained to be electrically insulated. Thereby, the photovoltaic module may be operated for 25 years or more without degradation of output characteristics. Accordingly, the backsheet for a photovoltaic cell should have excellent UV resistance and weather resistance, and excellent long-term reliability including less degradation of mechanical characteristics, moisture preventability and electric insulating properties during use.

To satisfy the above-described characteristics, currently, a product manufactured in a triple-layered structure in which a polyvinyl fluoride (PVF) film is stacked on both surfaces of a polyethylene terephthalate (PET) film is being widely used. However, the conventional art has a complicated manufacturing method and a problem of hydrolyzing an adhesive layer with moisture to adhere the PET film to the PVF film, and therefore it is difficult to maintain an interface adhesive strength with the long-term reliability.

In addition, recently, backsheets for a photovoltaic cell manufactured by processing another fluoropolymer such as polyvinylidene fluoride (PVDF), chlorotrifluoroethylene (CTFE) or ethylene chlorotrifluoroethylene (ECTFE) in the form of a film instead of the PVF film have been increasingly used, but the fluoropolymer still has a problem of a low adhesive strength.

For these reasons, there are ongoing demands for a backsheet for a photovoltaic cell which can have excellent durability and weather resistance while maintaining an adhesive strength for a long time, reduce a production cost due to a simple manufacturing method, and enhance productivity and quality of a photovoltaic module.

SUMMARY OF THE INVENTION

The present application is directed to providing a multi-layered film, a method of forming the same, a backsheet for a photovoltaic cell and a photovoltaic module.

One aspect of the present application provides a multi-layered film including a substrate and a fluoropolymer coating layer. The multi-layered film includes a primer layer having compatibility with a fluoropolymer between the substrate and the fluoropolymer coating layer, and the fluoropolymer coating layer shows gradation of a primer.

Another aspect of the present application provides a method of forming a multi-layered film, which includes forming a primer layer by coating a primer coating solution having compatibility with a fluoropolymer on a substrate; and coating a composition for coating a fluoropolymer not including a compatibilizer on the primer layer. After coating the primer layer and the fluoropolymer, diffusion between the two layers occurs, and thus an adhesive strength is enhanced.

The multi-layered film according to an exemplary embodiment of the present application may be used as a backsheet for various photovoltaic modules.

BRIEF DESCRIPTION OF THE DRAWINGS

The above and other objects, features and advantages of the present application will become more apparent to those of ordinary skill in the art by describing in detail exemplary embodiments thereof with reference to the adhered drawings, in which.

DETAILED DESCRIPTION OF EXEMPLARY EMBODIMENTS

Figure 1:
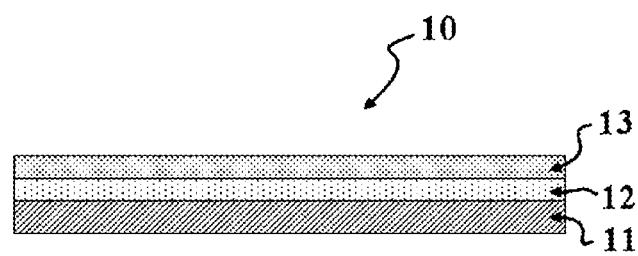
FIGS. 1 and 2 are cross-sectional views of multi-layered films according to exemplary embodiments of the present application.

Hereinafter, exemplary embodiments of the present application will be described in detail. However, the present application is not limited to the embodiments disclosed below, but can be implemented in various forms. The following embodiments are described in order to enable those of ordinary skill in the art to embody and practice the present application.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present application will be described in detail below. To aid in understanding the present application, like numbers refer to like elements throughout the description of the figures, and the description of the same elements will be not reiterated.

A multi-layered film according to one exemplary embodiment of the present application includes a substrate and a fluoropolymer coating layer, and a primer layer having compatibility with a fluoropolymer between the substrate and the fluoropolymer coating layer, and the gradation of a primer is shown in the fluoropolymer coating layer.

The multi-layered film sequentially includes a substrate, a primer layer and a fluoropolymer coating layer. Both of the primer layer and the fluoropolymer coating layer are formed by coating, and the fluoropolymer coating layer is directly formed on the primer layer. Though a composition for coating a fluoropolymer to form the fluoropolymer coating layer does not include a compatibilizer corresponding to a primer, a primer diffused into the fluoropolymer coating layer, which is a surface layer of the multi-layered film, may be shown after the fluoropolymer coating layer is formed, and the primer diffused into the fluoropolymer coating layer has gradation from a region close to the primer layer to a region close to a surface of the fluoropolymer coating layer, which is caused by the diffusion of the primer. Accordingly, the multi-layered film is further enhanced in interface adhesive strength.

The inventor has found an ideal structure in which a layer close to a substrate is increased in adhesive strength by increasing a ratio of a compatibilizer of a non-fluorine component having as excellent an adhesive strength to the substrate as possible, and a surface layer departing from the substrate, which is exposed to an external environment, is increased in weather resistance by increasing a ratio of fluorine as much as possible. According to previously known methods, to provide such an ideal structure, a manufacturing process thereof was complicated and difficult because a multi-layered structure should be provided by forming several fluorine films having different fluorine ratios, and adhering the films to each other. For this reason, the inventor coated a primer layer having excellent compatibility with a fluoropolymer on a substrate, instead of an adhesive layer, and then coated the fluoropolymer thereon, unlike the conventional art, thereby simplifying a process, and providing ideal effects for weather resistance and adhesive strength.

In other words, a multi-layered film according to an exemplary embodiment of the present application uses adhesion according to the diffusion of materials between two layers. The gradation of materials is created by the inter-diffusion between primers having excellent compatibilities with a fluoropolymer mono coating layer and a fluoropolymer of the underlying primer coating layer without formation of several fluorine films having different fluorine contents using the property in which an interface between the layers is removed due to the inter-diffusion in molecular chains when materials between two layers are in contact, and thus the layers are adhered to each other. Accordingly, a multi-layered film having excellent weather resistance and adhesive strength at the same time may be formed by increasing the ratio of a primer in a primer coating layer close to a substrate, and increasing the ratio of fluorine on a surface of a fluoropolymer coating layer.

Compared to the conventional method of adding a compatibilizer to a fluoropolymer layer to improve an adhesive strength of the fluoropolymer layer, the structure separately including a primer layer and a fluoropolymer coating layer like the multi-layered film according to the exemplary embodiment of the present application has excellent durability and uses a wide range of materials. The compatibilizer may be added to the fluoropolymer layer with limitation for use when there is a difference in solubility to a solvent between the fluoropolymer and the compatibilizer, that is, the compatibilizer is not easily dissolved in a solvent in which the fluoropolymer is easily dissolved or vice versa, compared to when the fluoropolymer is used alone. In addition, when compatibility between the fluoropolymer and the compatibilizer is decreased after the fluoropolymer and the compatibilizer are dissolved together in a specific solvent or co-solvent, it may be difficult to uniformly form a coating layer due to layer separation generated in a fluoropolymer coating solution. It is necessary to use a compatibilizer having high compatibility with the fluoropolymer since uniform coating appearance may not be achieved due to phase separation generated between the fluoropolymer and the compatibilizer after the coating solution is applied even if the layer separation is not generated in the fluoropolymer coating solution, or transmission may be decreased or an affect of increasing an adhesive strength may be offset due to an increased haze.

In contrast, in an exemplary embodiment of the present application including a separate fluoropolymer coating layer and a separate underlying primer layer, there is a less limitation for use of a primer even when there is a difference in solubility in a solvent between the fluoropolymer and the primer or the compatibility is a bit decreased, and thus a wide range of primers can be used, compared to when the compatibilizer is mixed with the fluoropolymer coating layer.

Moreover, in the method of adding and mixing the compatibilizer to the fluoropolymer coating solution, since it is necessary to dissolve the fluoropolymer and the compatibilizer at the same time, and then form a coating layer, the fluoropolymer and the compatibilizer should be dissolved in similar solvent systems and the compatibilizer should have a high compatibility with the fluoropolymer to form a uniform coating layer. In contrast, in the exemplary embodiment of the present application, since the fluoropolymer coating layer is formed on the primer layer, a fluoropolymer coating solution and a primer coating solution are separately prepared, and coating layers are also separately formed. Therefore, the solubilities of the fluoropolymer coating solution and the primer coating solution are not necessarily similar to each other and the limitation to compatibility is relatively less, and thus the range of selectable primers becomes wider.

Particularly, when the coating layer is formed by mixing a compatibilizer composed of a non-fluorine component, which has an excellent adhesive strength to the substrate with the fluoropolymer coating solution, a gradational diffusion effect of the fluoropolymer and the compatibilizer may not be provided. Therefore, the ratio of the compatibilizer present on a surface of the fluoropolymer coating layer increases, and it is difficult to ensure durability of the multi-layered film. When the ratio of the compatibilizer is decreased to ensure weather resistance, a sufficient adhesive strength may not be ensured. Alternatively, like the exemplary embodiments of the present application, when the separate fluoropolymer coating layer is formed over the primer layer having an excellent adhesive strength to the substrate, the ratio of the primer having a high adhesive strength is increased at an interface between the fluoropolymer coating layer and the primer layer due to the gradational diffusion effect of the primer, and gradation in which the ratio of the fluoropolymer is increased closer to the surface of the fluoropolymer coating layer (that is, farther from the primer layer) is created, thereby further improving weather resistance and durability, and thus achieving the characteristics of the adhesive strength and the weather resistance.

The gradational diffusion effect between the fluoropolymer and the primer is possibly controlled by controlling a thickness of the fluoropolymer coating layer, a glass transition temperature, a melting point, a softening point, a degree of crystallinity and a molecular weight of the fluoropolymer, and a solvent of the fluoropolymer coating solution. As the glass transition temperature, melting point, softening point, degree of crystallinity and molecular weight of the fluoropolymer are lower, a mobility of the fluoropolymer is increased, and therefore the diffusion effect may be increased, and when the solvent of the fluoropolymer coating solution has high solubility to the primer, the diffusion effect may also be increased.

In addition, as a thickness of the primer layer, a glass transition temperature, a melting point, a softening point, a molecular weight of the primer, a solvent of the primer coating solution, a degree of curing of a primer coating layer, and the compatibility between the primer layer and the fluoropolymer are controlled, a gradational diffusion rate of the primer may be controlled. That is, as the thickness of the primer layer is larger and the glass transition temperature, melting point, softening point, and molecular weight of the primer are decreased, the diffusion effect may be increased, and the diffusion effect may be controlled or the adhesive strength between the substrate and the primer layer may be enhanced by a method of partially curing the primer.

When the compatibility between the primer and the fluoropolymer is high, the diffusion effect is increased, but when the compatibility between the primer and the fluoropolymer becomes lower, the diffusion effect may be reduced.

In addition, after the primer layer is formed, the diffusion effect may be controlled by drying temperature and time in the coating of a fluoropolymer. As the fluoropolymer has a higher drying temperature or longer drying time, the diffusion effect may be increased, and particularly, the fluoropolymer having a high degree of crystallinity and melting point ($T_m$) may have a great influence on the diffusion effect by the drying conditions.

Structurally, to provide a gradational diffusion effect, a separate primer layer may be formed on the substrate before the coating of the primer having excellent compatibility with the fluoropolymer. For example, an aqueous acryl primer layer may be previously formed on the substrate, or a primer-treated substrate may be used.

In the multi-layered film according to the exemplary embodiment of the present application, though a compatibilizer composed of a non-fluorine component, which has an excellent adhesive strength to the substrate, is not included in the fluoropolymer coating layer, the diffusion of the primer into the surface of the fluoropolymer coating layer by the gradational diffusion effect of the primer may be observed through an IR spectrum. As an example, Fourier transform infrared spectroscopy (FTIR) according to the attenuated total reflectance (ATR) method (referred to as the "ATR FTIR") is a technique used to study a surface of a material by comparatively analyzing a wavelength detected by reflecting IR rays from the material with an original wavelength using two mirrors. Here, since each material has a unique range of wavelengths, and an intensity of the spectrum is changed based on the content of the material, the material can be subjected to qualitative and quantitative analyses. The component observed by the IR spectroscopy may be distributed within several micrometers from the outermost surface.

A specific kind of the substrate included in the multi-layered film according to the exemplary embodiments of the present application is not particularly limited, and various materials known in the art may be used, and selected according to a required function, use, etc.

In one example of the present application, the substrate may be a metal or polymer sheet. Here, the metal may be aluminum or iron, and the polymer sheet may be a polyester-based sheet, a polyamide-based sheet, or a polyimide-based sheet. Among them, the polyester-based sheet is generally used, but the present application is not limited thereto. The polyester-based sheet may be, but is not limited to, a mono sheet, a stacked sheet or a co-extrusion product of polyethylene terephthalate (PET), polyethylene naphthalate (PEN) or polybutylene terephthalate (PBT). In addition, a polyester-based sheet having enhanced hydrolysis resistant characteristics may be used when necessary.

The substrate may have a thickness of approximately 50 to 500 μm, or 100 to 300 μm. The multi-layered film may maintain excellent electric insulating properties, moisture barrier properties, mechanical properties and handleability by controlling the thickness of the substrate within the above-described range. However, the thickness of the substrate is not limited to the above-described range, but may be suitably controlled according to necessity.

The substrate may be subjected to high-frequency spark discharging treatment such as corona or plasma treatment; thermal treatment; flame treatment; treatment with a coupling agent; treatment with an anchoring agent; or chemical activation treatment using a gas-phase Lewis acid (ex. $BF_3$), sulfuric acid or high-temperature sodium hydroxide.

To further enhance moisture barrier characteristics, an inorganic oxide such as silicon oxide or aluminum oxide may be deposited on the substrate. In this case, the deposition-treated layer may also be subjected to the spark discharging treatment, flame treatment, treatment with a coupling agent, treatment with an anchoring agent, or chemical activation treatment, which was described above, to further enhance the adhesive strength.

The multi-layered film according to the exemplary embodiment of the present application includes a primer layer between the substrate and the fluoropolymer coating layer. In detail, the fluoropolymer coating layer is directly coated on the primer layer, and the primer layer has compatibility with the fluoropolymer included in the fluoropolymer coating layer, and an adhesive strength between the substrate and the fluoropolymer coating layer. The primer layer is formed by coating a primer coating solution having compatibility with the fluoropolymer on the substrate.

The primer includes a main chain backbone having compatibility with the fluoropolymer, and the fluoropolymer coating layer is formed on the primer layer.

The term "B having compatibility with A" used herein means that B is easily mixed or inter-diffused with A.

The main chain backbone of the primer is not particularly limited as long as it has the above-described properties, and may be, but is not limited to, at least one selected from the group consisting of a (meth)acryl-based main chain backbone; a urethane-based main chain backbone; an ether sulfone-based main chain backbone; an ether imine-based main chain backbone; an amide-based main chain backbone; a polyester-based main chain backbone; an aliphatic polyester-based main chain backbone; a polyester urethane-based main chain backbone; a (meth)acrylamide-based main chain backbone; a urea-based main chain backbone; a polycarbonate-based main chain backbone; and a main chain backbone of a free radical addition polymer induced from a monomer mixture including a (meth)acryl-based monomer, a (meth)acrylamide-based monomer or a vinyl-based monomer as a main component, and preferably at least one selected from the group consisting of an acryl-based main chain backbone; a polyester-based main chain backbone; an aliphatic polyester-based main chain backbone; a (meth) acrylamide-based main chain backbone; and a main chain backbone of a free radical addition polymer induced from a monomer mixture including an acryl-based monomer or a (meth)acrylamide-based monomer as a main component.

The primer layer has sufficient compatibility to exhibit an adhesive strength to the fluoropolymer included in a fluoropolymer coating layer to be described later and the substrate as described above. The primer layer and the fluoropolymer coating layer are all formed by a coating method, and thus an interface therebetween is removed due to the inter-diffusion occurring in molecular chains of the respective layers. That is, during the formation of the multi-layered film, at the interface between the primer layer and the fluoropolymer coating layer, the inter-diffusion occurs between the fluoropolymer include in the fluoropolymer coating layer and the primer. Accordingly, physical interactions by chain entanglement and the van der Waals' force can be expected to be generated between molecular chains of a component of the fluoropolymer coating layer and a component of the primer layer, and therefore the adhesive strength is enhanced. As a result, the two layers can be adhered without a separate adhesive, and the problem of durability generated by a conventional interface adhesive may be resolved.

In addition, the van der Waals' force may be further increased by a dipole-dipole interaction. Accordingly, in an example of the present application, the primer further includes a functional group, which may be introduced to an inside of a main chain, side chain or end of the polymer. That is, the primer includes a polymer including a main chain backbone having compatibility with the fluoropolymer, and a functional group introduced to an inside, side chain or end of the main chain backbone; a polymer including a main chain backbone having compatibility with the fluoropolymer and crosslinked with a compound capable of providing a functional group, or a mixture of a polymer including a main chain backbone having compatibility with a fluoropolymer and a functional group or a compound capable of providing the same.

In the exemplary embodiment of the present application, a kind of the functional group is not particularly limited. For example, the functional group may be one capable of enhancing an adhesive strength to the fluoropolymer coating layer through a dipole-dipole interaction by $C-F_2$ bonding of the fluoropolymer due to a high dipole moment. Accordingly, the van der Waals' force may be further increased by an interaction between a dipole of the $C-F_2$ bonding of the fluoropolymer included in the fluoropolymer coating layer and a dipole of the functional group of the primer. That is, when the fluoropolymer coating layer and the primer layer are inter-diffused by an excellent compatibility with each other and a dipole-dipole interaction, a physical or chemical interaction can be expected to further increase, and thus the adhesive strength is enhanced.

In addition, the chemical or physical interaction such as a hydrogen bond, ion bond or covalent bond formed between a functionalized group included in the fluoropolymer included in the fluoropolymer coating layer, which is a surface layer, a filler or a dispersing agent and a functional group of the primer layer may further enhance an adhesive strength.

The functional group may be, but is not limited to, at least one selected from the group consisting of a carboxyl group, a sulfonic acid group, an aziridine group, an acid anhydride group, an amine group, an isocyanate group, a cyanuramide group, an epoxy group, a hydroxyl group, an ester functional group, a carbamate functional group, an amide group, a urea group, an imide group, a phosphate group, a phosphoric acid group, an oxazoline group, a cyano group, a cyanate group and an imine group, and preferably, at least one selected from the group consisting of a carboxyl group, a sulfonic acid group, an acid anhydride group, an amine group, an epoxy group, a hydroxyl group, an oxazoline group, and a cyano group.

In the exemplary embodiment of the present application, a kind of a material capable of introducing or providing the functional group to a main chain backbone is not particularly limited, and a compound widely known in the art may be used to introduce a corresponding functional group. The compound may be glycidyl(meth)acrylate, glycidyl alkyl (meth)acrylate, (meth)acrylic acid, isocyanato alkyl(meth) acrylate, hydroxyalkyl(meth)acrylate, maleic acid anhydride, p-toluene sulfonic acid, phosphoric acid, (meth) acrylamide, (meth)acrylonitrile or alkylaminoalkyl(meth) acrylate. The functional group may be introduced by a method of polymerizing the compound with polymerization of a main chain of a polymer, or grafting the compound to a side chain or end of the main chain of the polymer under a suitable condition for an addition reaction, or a method of crosslinking the polymer using the compound, and in some cases, the compound may be mixed with a polymer in the primer layer, separate from the polymer. Various methods capable of introducing a desired functional group into a polymer are known in the art, and all of them may be applied to the exemplary embodiment of the present application.

According to another exemplary embodiment of the present application, the primer layer may further include a curing agent. By including a curing agent, a diffusion effect of a primer may be controlled, and an adhesive strength of the primer layer may be enhanced, A curing agent which may be used in the exemplary embodiment of the present application is not particularly limited, but may include a functional group capable of making a chemical bond with a hydroxyl or carboxyl group on a surface of a PET base film, or curing a functional group of the primer. The curing agent may be at least one selected from the group consisting of a melamine compound, an oxazoline compound, a compound including an aziridine group, an isocyanate compound, an amine compound and an amide compound.

In the exemplary embodiment of the present application, the primer layer may have a thickness of approximately 10 to 5,000 nm, 50 to 2,000 nm, or 150 to 2,000 nm, but the thickness may be suitably changed according to a desired adhesive property and a kind of the fluoropolymer of the surface layer.

A multi-layered film according to the exemplary embodiment of the present application includes the fluoropolymer coating layer formed on the primer layer. In detail, the fluoropolymer coating layer including a fluoropolymer is formed by a method of coating a coating solution prepared by dissolving a fluoropolymer in a solvent, for example, having a low boiling point on the primer layer, rather than a method of laminating a sheet prepared by a casting or extrusion method on the substrate or primer layer using an adhesive.

In the exemplary embodiment of the present application, the fluoropolymer coating layer includes a fluoropolymer including a non-crystalline region and having a degree of crystallinity of less than 60%. As the layer including the fluoropolymer is formed by coating, the inter-diffusion with the primer layer is effectively performed, and thus the effect of enhancing an adhesive strength may be maximized. In addition, as the fluoropolymer is formed, a solvent having a low boiling point may be used in the formation of the fluoropolymer coating layer, and thus a dry process may be performed at a low temperature, resulting in enhancing productivity of a product and ensuring excellent quality.

In the exemplary embodiment of the present application, the fluoropolymer having a non-crystalline region may have a degree of crystallinity of less than 55%, 50% or less, or 10 to 50%. The term "degree of crystallinity" used herein refers to a percentage (based on a weight) of a crystalline region included in an entire resin, and may be measured by a known method such as differential scanning calorimetry. For example, the measurement of the degree of crystallinity of the fluoropolymer according to the differential scanning calorimetry may be performed as follows: a rate of raising a temperature is set to 10° C. per minute, a heat of fusion ($\Delta$Hf) is measured in a secondary temperature raising operation, and then the degree of crystallinity of each polymer may be estimated based on the heat of fusion ($\Delta$Hf=105 J/g) of polyvinylidenefluoride having a degree of crystallinity of 100%.

The fluoropolymer having the above-described degree of crystallinity may be prepared by copolymerizing a suitable comonomer in the preparation of the fluoropolymer to decompose a regular arrangement of elements of the fluoropolymer, or polymerizing the polymer in the form of a branched polymer. In addition, the degree of crystallinity of the fluoropolymer coating layer may be achieved by mixing at least two fluoropolymers.

A specific kind of the fluoropolymer having a non-crystalline region is not particularly limited, and the fluoropolymer may be a monopolymer, copolymer or mixture thereof, which includes at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluoro butylethylene, perfluoro(methylvinylether) (PMVE), perfluoro (ethylvinylether) (PEVE), perfluoro(propylvinylether) (PPVE), perfluoro(hexylvinylether) (PHVE), perfluoro-2,2-dimethyl-1,3-dioxole (PDD), and perfluoro-2-methylene-4-methyl-1,3-dioxolane (PMD) in a polymerized form.

In one exemplary embodiment of the present application, the fluoropolymer may be a monopolymer or copolymer including vinylfluoride in a polymerized form; a monopolymer or copolymer including vinylidene fluoride in a polymerized form; or a mixture including at least two thereof.

A kind of the comonomer included in the copolymer in a polymerized form is not particularly limited, and the comonomer may be, but is not limited to, one or at least two of hexafluoropropylene (HFP), chlorotrifluoroethylene (CTFE), tetrafluoroethylene (TFE), trifluoroethylene, hexafluoroisobutylene, perfluoro butylethylene, perfluoro (methylvinylether) (PMVE), perfluoro(hexylvinylether) (PHVE), perfluoro-2,2-dimethyl-1,3-dioxole (PDD) and perfluoro-2-methylene-4-methyl-1,3-dioxolane (PMD), and preferably at least one of hexafluoropropylene (HFP) and chlorotrifluoroethylene (CTFE).

For example, the fluoropolymer may be polyvinylidene fluoride (PVDF) including at least one comonomer selected from the group consisting of hexafluoropropylene (HFP), chlorotrifluoroethylene (CTFE), tetrafluoroethylene (TFE), trifluoroethylene, hexafluoroisobutylene, perfluorobutylethylene, perfluoro(methylvinylether) (PMVE), perfluoro(hexylvinylether) (PHVE), perfluoro-2,2-dimethyl-1,3-dioxole (PDD) and perfluoro-2-methylene-4-methyl-1,3-dioxolane (PMD) in a polymerized form.

A content of the comonomer in the copolymer may be approximately 0.5 to 50, 1 to 40, 7 to 40, 10 to 30, or 10 to 20 wt % based on a total weight of the copolymer. In this content range of the comonomer, the durability and weather resistance of the multi-layered film may be ensured, and effective inter-diffusion and low-temperature drying may be induced.

In the exemplary embodiment of the present application, the fluoropolymer may have a weight average molecular weight of 50,000 to 1,000,000. The weight average molecular weight is a conversion value of standard polystyrene measured by gel permeation chromatography (GPC). In the exemplary embodiment of the present application, as the weight average molecular weight of the resin is controlled as described above, excellent solubility and other physical properties may be ensured.

The fluoropolymer may have a melting point of 80 to 175° C. or 120 to 165° C. In the exemplary embodiment of the present application, as the melting point of the resin is controlled to 80° C. or more, transformation occurring in use of the multi-layered film may be prevented, and as the melting point of the resin is controlled to 175° C. or less, the solubility to a solvent may be controlled, and glossiness of a coating surface may be enhanced.

The fluoropolymer coating layer according to the exemplary embodiment of the present application may further include a non-crystalline resin with the fluoropolymer as described above when necessary. Likewise, as a blend with the non-crystalline resin is used, the interaction with the primer layer described above and a processibility including the solubility to a low-boiling-point solvent may be further maximized. The term "non-crystalline resin" used herein includes a resin in which the entire structure of the resin has non-crystallinity, as well as a resin in which a part of the resin has a crystalline region as long as the non-crystalline region is more dominant than the crystalline region.

A kind of the non-crystalline resin which may be used in the exemplary embodiment of the present application is not particularly limited, and the non-crystalline resin may be, but is not limited to, one or a mixture of at least two of an acryl-based resin, polycarbonate, polyvinylchloride, a styrene-(meth)acrylonitrile copolymer, a styrene-maleic acid anhydride copolymer, a cycloolefin polymer, polyacrylonitrile, polystyrene, polysulfone, polyethersulfone and polyarylate, and preferably a non-reactive acryl-based resin.

The acryl-based resin may be a monopolymer or copolymer including one or at least two of methyl(meth)acrylate, ethyl(meth)acrylate, propyl(meth)acrylate, butyl(meth)acrylate, (meth)acrylic acid and isobornyl(meth)acrylate in a polymerized form. In addition, in some cases, to control a glass transition temperature and molecular weight distribution, an acryl-based resin including one or at least two of the above-described monomers; and at least one comonomer such as cyclohexyl maleimide, methyl styrene or (meth)acrylonitrile in a polymerized form may be used.

When the non-crystalline resin is prepared in the form of a copolymer including at least two kinds of monomers in a polymerized form, the kind and content of the comonomer may be controlled in consideration of desired non-crystallinity without particular limitation.

In the exemplary embodiment of the present application, when the fluoropolymer coating layer includes a non-crystalline resin, the fluoropolymer coating layer may include a fluorine-based resin at 50 parts by weight or more, and a non-crystalline resin at 50 parts by weight or less. Alternatively, the fluoropolymer coating layer may include a fluorine-based resin at 70 to 97 parts by weight and a non-crystalline resin at 3 to 30 parts by weight. As the weight ratio of the resins is controlled as described above, the component constituting the fluoropolymer coating layer may have a suitable degree of crystallinity, the inter-diffusion with the primer layer may be effectively performed, and the multi-layered film may have excellent physical properties such as durability and weather resistance.

Unless specifically defined otherwise, the unit "parts by weight" used herein refers to a weight ratio between components.

The fluoropolymer coating layer may further include a pigment or filler to control the color or opacity of the fluoropolymer coating layer or for other purposes, as well as the above-described components. Here, the pigment or filler which may be used may be a metal oxide such as titanium dioxide ($TiO_2$), silica or alumina, a black pigment such as calcium carbonate, barium sulfate or carbon black, or a pigment component showing a different color, but the present application is not limited thereto. The pigment or filler described above may also serve to further improve an interface adhesive strength in the inter-diffusion of the fluoropolymer coating layer and the primer layer due to a unique functional group included in each component, along with the unique effect of controlling the color or opacity of the fluoropolymer coating layer. The content of the pigment may be 60 wt % or less based on a solid content of the fluoropolymer coating layer, but the present application is not limited thereto.

The fluoropolymer coating layer may further include a conventional component such as a UV stabilizer, a thermal stabilizer, a dispersing agent or barrier particles.

In exemplary embodiments of the present application, the fluoropolymer coating layer including such a component may have a thickness of approximately 3 to 50 μm or 10 to 30 μm, but the thickness may be changed according to a purpose.

Figure 2:
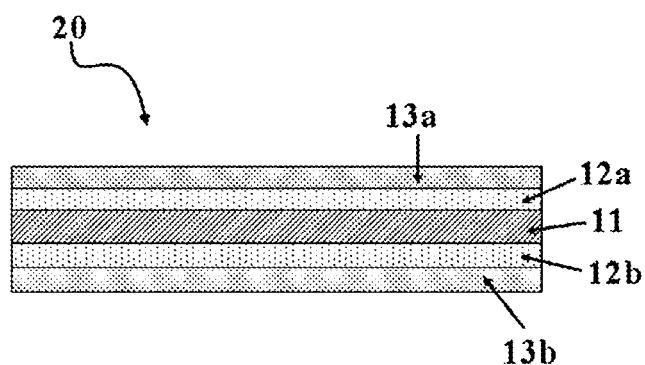

FIGS. 1 and 2 show multi-layered films according to exemplary embodiments of the present application. As shown in FIG. 1, a multi-layered film 10 may include a substrate 11, a primer layer 12 formed on a surface of the substrate, and a fluoropolymer coating layer 13 formed on the primer layer 12, or as shown in FIG. 2, a multi-layered film 20 may include primer layers 12a and 12b formed on both surfaces of a substrate 11 and fluoropolymer coating layers 13a and 13b formed on the primer layers 12a and 12b, respectively.

The multi-layered film according to an exemplary embodiment of the present application may further include a separate primer layer between the primer layer and the substrate to enhance an adhesive strength. A method of forming the additional primer layer may be performed before an extension process in the manufacture of a base film, or through an in-line method during the extension process without particular limitation, and may use an aqueous primer which may be dissolved in water before application in consideration of a process and an environment. While the method described above is generally performed by a base film manufacturer, it is usually performed at a high temperature of 200° C. or more to cure the primer. Therefore, when using an organic solvent, the method described above may not be appropriate in terms of risk of fire and environmentally friendly aspects.

In addition, the multi-layered film according to the exemplary embodiment of the present application may further include various functional layers known in the art when necessary. The functional layer may be an adhesive layer or an insulating layer. For example, as described above, the primer layer and the fluoropolymer coating layer are formed on one surface of the substrate, and on the other side of the substrate, an adhesive layer and an insulating layer may be sequentially formed. The adhesive layer or insulating layer may be formed by various methods known in the art. For example, the insulating layer may be a layer of ethylene vinylacetate (EVA) or linear low-density polyethylene (LDPE). The layer of EVA or linear LDPE serves as an insulating layer and may also serve to increase an adhesive strength to an encapsulant, reduce a production cost, and maintain excellent re-workability.

Another exemplary embodiment of the present application is directed to providing a method of forming a multi-layered film having an enhanced adhesive strength after coating of a primer layer and a fluoropolymer due to inter-diffusion between the two layers. The method includes forming a primer layer by coating a primer coating solution having compatibility with a fluoropolymer on a substrate, and coating a composition for coating a fluoropolymer, which does not include a compatibilizer, on the primer layer.

The method of forming a multi-layered film according to the exemplary embodiment of the present application is characterized by forming all of the primer layer and fluoropolymer layer by coating. Here, a coating method is not particularly limited, and any one of the methods capable of forming a coating layer, including offsetting, gravure coating, roll coating and knife-edge coating, may be employed.

For example, the primer layer may be formed by coating a primer coating solution having compatibility with the fluoropolymer on the substrate, and drying the coated solution under the predetermined conditions.

The primer may be a polymer having a main chain backbone described above, a polymer having a functional group introduced into the main chain backbone, or a mixture of the polymer having the main chain backbone and a compound having the functional group, and the coating solution may be prepared by dissolving or dispersing the polymers in a suitable organic or aqueous solvent. The organic solvent may be one or a mixture of at least two of methylethylketone, ethanol, isopropanol, toluene, ethyl acetate, butyl acetate and cyclohexanol, and the aqueous solvent may be water.

Various additives may be further included in the coating solution when necessary. For example, as described above, the primer coating solution may include a curing agent. Due to the curing agent, an effect of diffusing a primer may be controlled, and an adhesive strength of the primer layer may be enhanced.

A specific kind of the substrate capable of being used in the manufacturing method is as described above, and the substrate may be further subjected to suitable deposition treatment, plasma treatment, corona treatment, treatment with a primer, anchoring agent or coupling agent, or thermal treatment.

In the exemplary embodiment of the present application, the primer layer is formed by the method as described above, and the fluoropolymer coating layer is formed by coating. A coating solution forming the fluoropolymer coating layer may be prepared by dissolving or dispersing each component forming the above-described fluoropolymer coating layer in a solvent having a relatively low boiling point, specifically 200° C. or less. The lower limit of the boiling point of the solvent is not particularly limited. As the fluoropolymer has a non-crystalline region or is mixed with a non-crystalline resin, it may be effectively dissolved in the solvent having a relatively low boiling point. Accordingly, in the exemplary embodiment of the present application, since a high-temperature drying process is not required in the formation of the multi-layered film, a production cost can be reduced, thermal transformation or heat shock of the substrate which may occur during high-temperature drying can be prevented, and the quality of a product can be enhanced.

The solvent described above may be, but is not limited to, one or a mixture of at least two of acetone, methylethylketone (MEK), dimethylformamide (DMF) and dimethyl acetamide (BMAC).

In addition, the composition for coating the fluoropolymer may be an aqueous dispersion-coated composition. For example, an aqueous dispersion including a fluoropolymer dispersed in water may be coated, and in this case, the aqueous dispersion may include a dispersing agent.

In the exemplary embodiment of the present application, the coating solution applied to form a fluoropolymer coating layer may further include various additives such as a pigment, a filler, a UV stabilizer, a dispersing agent, or a thermal agent as well as the fluoropolymer. Each additive may be dissolved in a solvent with the fluoropolymer, etc., or mixed with a solvent including the fluoropolymer after being prepared in the form of a millbase, separate from the above-described components.

In the exemplary embodiment of the present application, a method of preparing the coating solution or a ratio of components included in the coating solution is not particularly limited, and various methods known in the art may be suitably employed.

In the exemplary embodiment of the present application, a coating method using the fluoropolymer coating solution is not particularly limited, and may be performed based on the coating method for forming a primer layer described above. Particularly, in the coating operation, the solvent for the coating solution causes a surface of the primer layer to swell, and therefore can stimulate the inter-diffusion between the primer layer and the fluoropolymer coating layer.

In the exemplary embodiment of the present application, followed by the coating process of each layer, an operation of drying the coating layers may be further performed. Conditions for the drying operation are not particularly limited, and the drying operation may be performed at 200° C. or less, or approximately 100 to 180° C. for approximately 30 seconds to 30 minutes or 1 to 10 minutes. As the drying conditions are controlled as described above, the increase in production cost may be prevented, and degradation in product quality due to thermal transformation or heat shock may be prevented. In addition, according to the drying condition, a degree of diffusion of the primer into the fluoropolymer coating layer may be controlled. For example, as the drying temperature of the fluoropolymer is higher, or drying time thereof is longer, the diffusion effect may be increased. In addition, when the fluoropolymer has a high degree of crystallinity and a high melting point ($T_m$), an influence of the diffusion effect according to the drying conditions may be greater.

Likewise, to provide a multi-layered film having an excellent adhesive strength without using a separate adhesive or adhesive layer, a thickness of the primer layer or fluoropolymer coating layer may be controlled, and as the primer layer is thicker and the fluoropolymer coating layer is thinner, the diffusion effect of the primer becomes greater. In addition, the degree of diffusion may be controlled by controlling a glass transition temperature, melting point, softening point or molecular weight of the primer and fluoropolymer itself. Moreover, the diffusion may be generated well as the degree of crystallinity of the fluoropolymer is lower, and the degree of diffusion may be controlled according to miscibility of the solvent for the coating solution of each layer.

Still other exemplary embodiments of the present application are directed to providing a backsheet for a photovoltaic cell including the multi-layered film, and a photovoltaic module including the backsheet for a photovoltaic cell. A structure of the photovoltaic module is not particularly limited, as long as it includes the multi-layered film as a backsheet. The photovoltaic module may have various structures known in the art.

Conventionally, a photovoltaic module may include a transparent top-emission substrate, a backsheet, and a photovoltaic cell encapsulated by an encapsulant between the top-emission substrate and the backsheet or a photovoltaic cell array arranged in series or parallel.

Here, a representative example of an active layer constituting the photovoltaic cell or photovoltaic cell array may be a crystalline or non-crystalline silicon wafer or a compound semiconductor such as CIGS or CTS.

The multi-layered film according to the exemplary embodiment of the present application may include a module having the above-described active layer, and thus may be applied to various photovoltaic modules known in the art without limitation. In this case, a method of composing the module, or kinds of other materials are not particularly limited.

The present application will be described in further detail with reference to Examples according to the present application and Comparative Examples not according to the present application. However, the scope of the present application is not limited to the following Examples.

In Examples and Comparative Examples, physical properties of a sheet were measured as follows:

1. 180 Degree Peel Strength

A peel strength was measured by cutting a specimen to a width of 10 mm according to ASTM D1897, and peeling the specimen at a rate of 4.2 mm/sec and a peeling angle of 180 degrees.

2. Cross-Hatch Adhesive Strength

A cross-cut test was performed according to the standard for a cross-cut test, that is, a specification of ASTM D3002/D3359. Specifically, a specimen was cut at 1 mm intervals in horizontal and vertical directions by 11 rows using a knife, thereby forming a grid of 100 squares having length and width of 1 mm×1 mm, respectively. Afterward, as a CT-24 adhesive tape produced by Nichiban was attached to the grid-formed surface and then detached, a state of the surface detached along with the tape was measured and evaluated according to the following criteria.

<Criteria for Evaluating Cross-Hatch Adhesive Strength>

5B: no detached region

4B: area of detached region is no more than 5% based on total surface area

3B: area of detached region is 5 to 15% based on total surface area

2B: area of detached region is 15 to 35% based on total surface area

1B: area of detached region is 35 to 65% based on total surface area

0B: almost all of region is detached from surface

3. Pressure Cooker Test (PCT)

The change in adhesive strength was observed after each of the multi-layered films formed in Examples and Comparative Examples in which both surfaces of a substrate were coated with a fluoropolymer was left in an oven maintaining conditions of 2 atm, 121° C. and 100% R.H. for 25, 50 or 75 hours.

4. Attenuated Total Reflectance Fourier Transform Infrared Spectroscopy (ATR FTIR Spectrum)

A degree of diffusion of a primer into a fluoropolymer coating layer was measured through an ATR FTIR spectrum. The ATR method was used to study a surface of a material, and performed on a surface of a fluoropolymer coating layer of a sample using an IR spectrophotometer.

Example 1

Preparation of Primer 400 g of toluene was put into a 1 L reactor in a nitrogen atmosphere, a temperature was maintained at 100° C., and monomers of 16 g of styrene, 76 g of methylmethacrylate (MMA), 24 g of butylacrylate (BA) and 84 g of glycidylmethacrylate (GMA) were prepared in a 3-neck reactor. An initiator solution was prepared by dissolving 10 g of an azo-based initiator, V-65, in 30 g of toluene on one side. The initiator solution was slowly dropped for 2 hours, and 3 minutes after the dropping of the initiator started, the monomers started dropping slowly for total 2 hours and 30 minutes. After 5 hours based on the time to drop the initiator, the reaction was terminated, thereby obtaining a primer, that is, an acryl copolymer.

Preparation of Primer Coating Solution

The prepared primer and an oxazoline curing agent (Nippon Shokubai Co., Ltd., WS-500, Solid Content: 40%) were mixed in a ratio of 10:1, and the mixture was diluted in a mixed solvent having methyl ethylketone and ethanol in a weight ratio of 1:1 to have a solid content of the primer of 5%, thereby preparing a primer coating solution.

Preparation of Coating Solution for Fluoropolymer Coating Layer 70 g of a copolymer (P(VDF-CTFE)) of vinylidene fluoride (VDF) and chlorotrifluoroethylene (CTFE), which had a degree of crystallinity of 25% and a melting point of 165° C., and 30 g of a copolymer (P(VDF-HFP)) of VDF and hexafluoropropylene (HFP), which had a degree of crystallinity of 24% and a melting point of 130° C., were melted in 400 g of N,N-dimethyl formamide (DMF), thereby preparing a first coating solution.

In addition, separate from the above-described solution, 0.6 g of a pigment dispersing agent, BYK111 (BYK), and 60 g of titanium dioxide (TiPure TS6200, Dupont) were added to 20 g of DMF, and 50 g of zirconia beads having a diameter of 0.3 mm were added. The resulting mixture was stirred at a rate of 1,000 rpm for 1 hour, and the beads were completely removed, thereby preparing a millbase.

80.6 g of the prepared millbase was added to the previously prepared first coating solution and stirred, thereby preparing a fluoropolymer coating solution.

Formation of Primer Layer

The primer coating solution prepared above was coated on a poly(ethylene terephthalate) (PET, thickness: 250 μm, Skyrol SG00L, SKC) film. The coating was performed using a Mayer bar having a thickness interval of 6.86 μm. After coating, the coated film was dried in an oven at approximately 120° C. for approximately 1 minute, and thereby a primer layer was formed to a thickness of 0.3 μm.

Formation of Fluoropolymer Coating Layer

The fluoropolymer coating solution prepared above was coated on the primer coating layer using an applicator by controlling an interval to have a dry thickness of approximately 20 μm, and the coated substrate was dried in an oven at 180° C. for approximately 2 minutes, thereby forming a fluoropolymer coating layer. Afterward, coating was performed in the same manner on a surface of the fluoropolymer coating layer opposite to the surface having the coated substrate, thereby forming a multi-layered film having a fluoropolymer coating layer formed on both surfaces of a PET sheet by means of a primer layer.

Example 2

A multi-layered film was formed by the method as described in Example 1, except that the fluoropolymer coating layer was controlled to a thickness of 10 μm.

Example 3

A multi-layered film was formed by the method as described in Example 1, except that the mixed ratio of a primer and an oxazoline curing agent (Nippon Shokubai Co., Ltd., WS-500, Solid Content: 40%) was changed to a ratio of 9:2.5, and a solid content of the primer was 5% in the preparation of a primer coating solution.

Example 4

A multi-layered film was formed by the method as described in Example 3, except that a solid content of a primer was 20% in the preparation of a primer coating solution, and a primer layer had a thickness of 1.4 μm.

Example 5

A multi-layered film was formed by the method as described in Example 3, except that a solid content of a primer was 40% in the preparation of a primer coating solution, and a primer layer had a thickness of 2.7 μm.

Comparative Example 1

A multi-layered film was formed by the method as described in Example 1, except that a fluoropolymer coating layer was formed on a substrate without forming a primer layer, and the primer and the oxazoline curing agent used in Example 1 were added to a fluoropolymer coating solution as compatibilizers. A ratio of the compatibilizer added to the fluoropolymer coating solution was calculated by converting an amount of the compatibilizer according to a thickness of the primer layer as shown in Table 1, and the compatibilizer was used in such an amount that the primer layer had a thickness of 0.3 μm.

TABLE 1

| Solid Content of Primer (%) | Thickness of Primer Layer (μm) | Ratio of Compatibilizer (%) |
|---|---|---|
| 1 | 0.07 | 0.2 |
| 5 | 0.3 | 1.1 |
| 10 | 0.7 | 2.3 |
| 20 | 1.4 | 4.6 |
| 30 | 2.1 | 6.9 |
| 40 | 2.7 | 9.1 |

Comparative Example 2

A multi-layered film was formed by the method as described in Example 3, except that a fluoropolymer coating layer was formed on a substrate without forming a primer layer, and the primer and oxazoline curing agent used in Example 3 were added to a fluoropolymer coating solution as compatibilizers. A ratio of the compatibilizer added to the fluoropolymer coating solution was calculated by converting an amount of the compatibilizer according to a thickness of the primer layer as shown in Table 1, and the compatibilizer was used in such an amount that the primer layer had a thickness of 0.3 μm.

Comparative Example 3

A multi-layered film was formed by the method as described in Example 4, except that a fluoropolymer coating layer was formed on a substrate without forming a primer layer, and the primer and oxazoline curing agent used in Example 4 were added to a fluoropolymer coating solution as compatibilizers. A ratio of the compatibilizer added to the fluoropolymer coating solution was calculated by converting an amount of the compatibilizer according to a thickness of the primer layer as shown in Table 1, and the compatibilizer was used in such an amount that the primer layer had a thickness of 1.4 μm.

Experimental Example 1

The 180 degree peel strength and cross-hatch tests were performed on the multi-layered films in Examples 1 to 5 and Comparative Examples 1 and 3 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Tables 2 and 3.

TABLE 2

| | Category | Example 1 | Example 2 | Example 3 | Example 4 | Example 5 |
|---|---|---|---|---|---|---|
| Fluorine Layer | (P(VDF-CTFE)) | 70 g | 70 g | 70 g | 70 g | 70 g |
| | (P(VDF-HFP)) | 30 g | 30 g | 30 g | 30 g | 30 g |
| | TS62000 | 60 g | 60 g | 60 g | 60 g | 60 g |
| | Thickness (μm) | 20 | 10 | 20 | 20 | 20 |
| Primer Layer | Acryl Copolymer:WS-500 | 10:1 | 10:1 | 9:2.5 | 9:2.5 | 9:2.5 |
| | Thickness (μm) | 0.3 | 0.3 | 0.3 | 1.4 | 2.7 |
| Cross-hatch Test Results | 0 h | 5B | 5B | 5B | 5B | 5B |
| | 25 h | 5B | 5B | 5B | 5B | 5B |
| | 50 h | 5B | 5B | 5B | 5B | 5B |
| | 75 h | 5B | 5B | 5B | 5B | 5B |
| 180 Degree Peel Strength (N/cm) | 0 h | Coat-T | Coat-T | Coat-T | Coat-T | Coat-T |
| | 25 h | Coat-T | Coat-T | Coat-T | Coat-T | Coat-T |
| | 50 h | Coat-T | Coat-T | Coat-T | Coat-T | Coat-T |
| | 75 h | Coat-T | Coat-T | Coat-T | Coat-T | Coat-T |

Coat-T: measurement of exact peel strength was impossible because the fluoropolymer coating layer was torn during peeling

TABLE 3

| Category | | Comparative Example 1 | Comparative Example 2 | Comparative Example 3 |
|---|---|---|---|---|
| Fluorine Layer | (P(VDF-CTFE)) | 70 g | 70 g | 70 g |
| | (P(VDF-HFP)) | 30 g | 30 g | 30 g |
| | TS62000 | 60 g | 60 g | 60 g |
| | Acryl Copolymer | 1 g | 0.9 g | 3.6 g |
| | WS-500 | 0.1 g | 0.25 g | 1 g |
| | Thickness (μm) | 20 | 20 | 20 |
| Cross-hatch Test Results | 0 h | 0B | 0B | 0B |
| | 25 h | 0B | 0B | 0B |
| | 50 h | 0B | 0B | 0B |
| | 75 h | 0B | 0B | 0B |
| 180 Degree Peel Strength (N/cm) | 0 h | 0 | 0 | 0 |
| | 25 h | 0 | 0 | 0 |
| | 50 h | 0 | 0 | 0 |
| | 75 h | 0 | 0 | 0 |

As shown in Tables 2 and 3, it can be confirmed that a multi-layered film according to Example of the present application including a primer layer obtained a favorable adhesive strength regardless of a thickness of the primer layer, and showed an excellent adhesive strength even after the PCT was performed for 75 hours. Meanwhile, it was confirmed that when an acryl copolymer, as a compatibilizer, was added to a fluoropolymer coating layer instead of the primer layer, the adhesive strength was considerably decreased. Accordingly, when the compatible primer layer was formed, compared to when a compatibilizer was applied to the fluoropolymer coating layer, it could be confirmed that a more favorable interface adhesive strength was obtained.

Experimental Example 2

Figure 3:
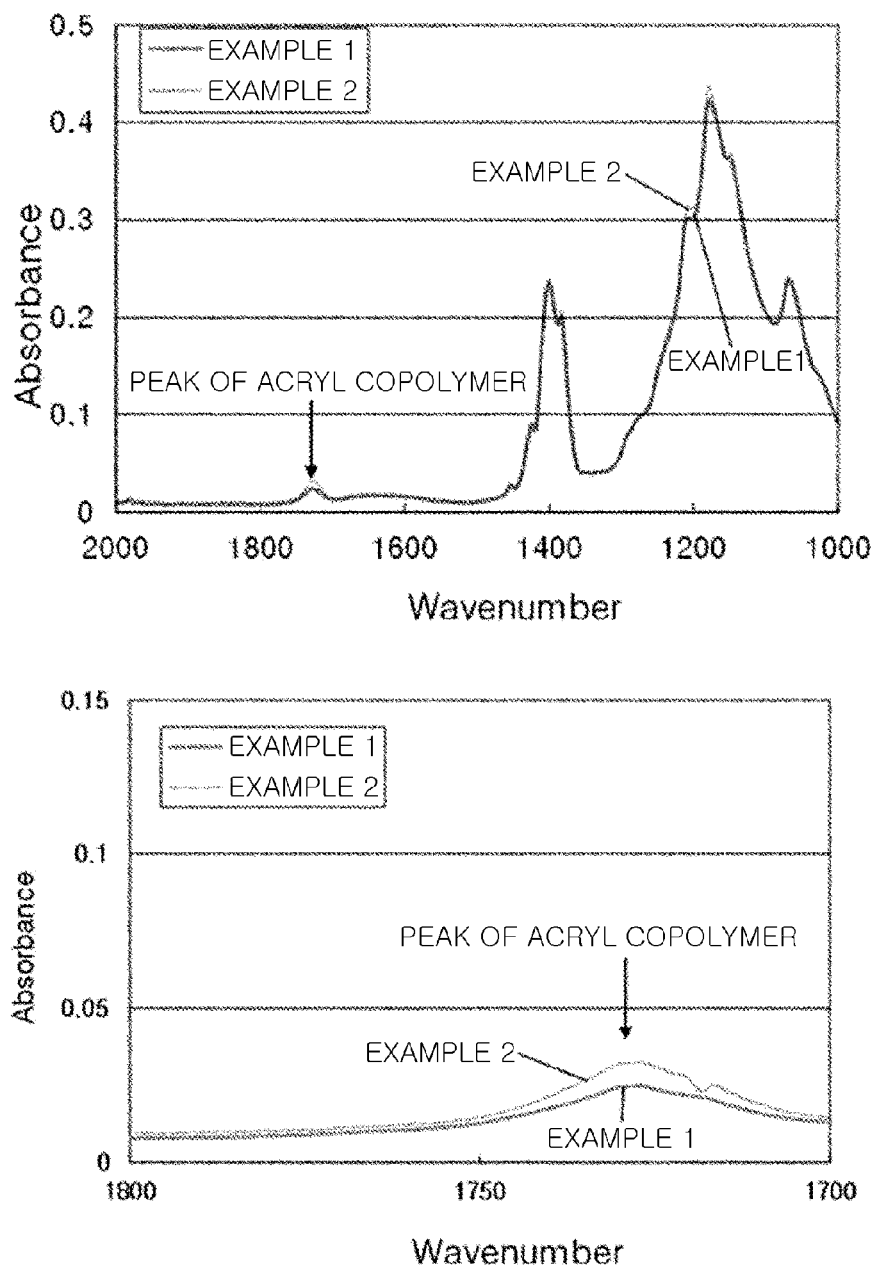
FIG. 3 shows ATR FTIR spectra for multi-layered films of Examples 1 and 2.

FIG. 3 shows ATR FTIR spectra of the multi-layered films of Examples 1 and 2, measured on a surface of a fluoropolymer coating layer. As an example, a result of an ATR-FTIR spectrum with respect to a fluoropolymer monolayer without a primer layer is shown in FIG. 4.

Figure 4:
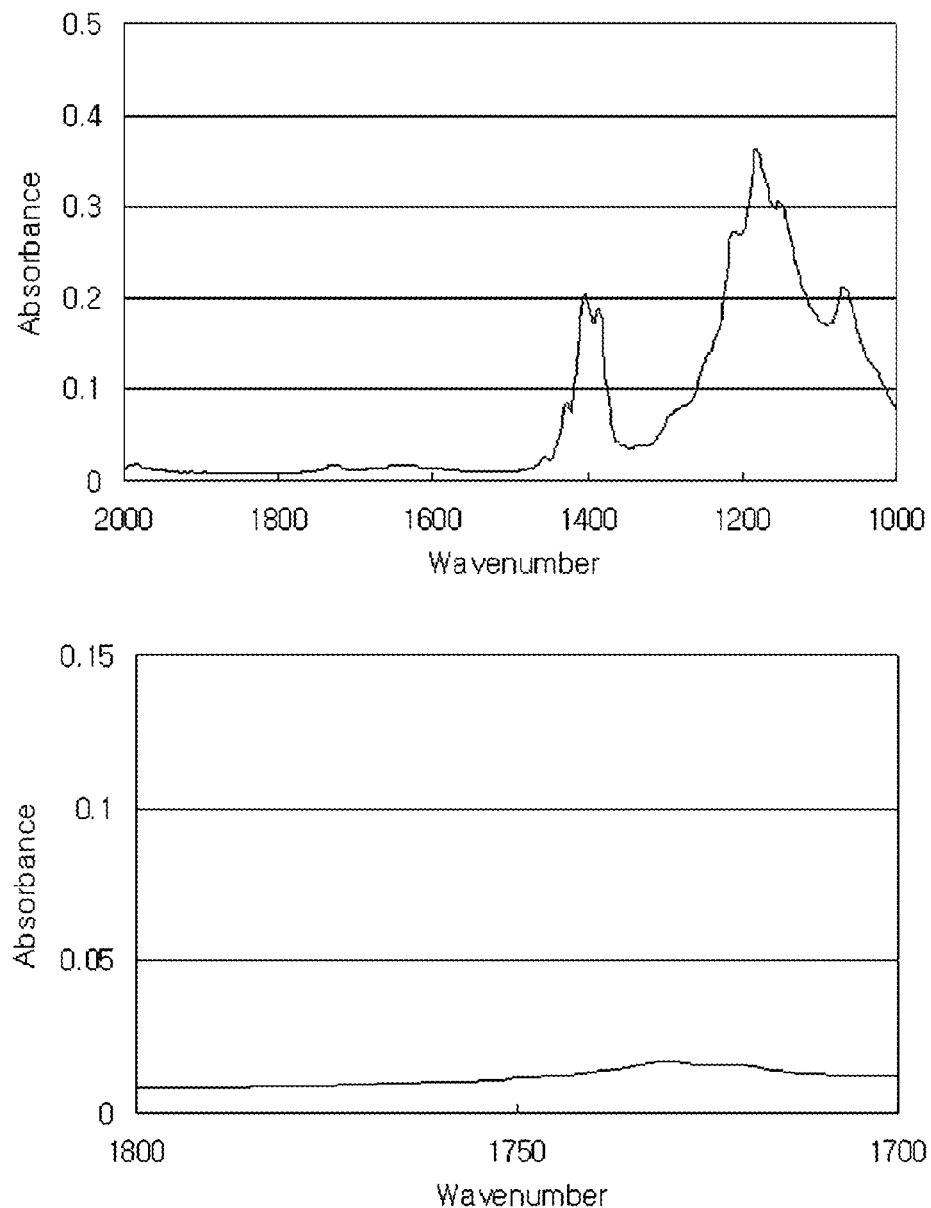
FIG. 4 shows ATR FTIR spectra for fluoropolymer monolayers.

Referring to FIGS. 3 and 4, it can be confirmed that, in the multi-layered film according to Example of the present application, the IR spectrum of an acryl copolymer was observed on a surface of the fluoropolymer coating layer in a wavelength of approximately 1700 to 1750, which was not observed in FIG. 4. The ATR FTIR spectrum can detect a material at approximately 5 μm from a surface, and the fact that the IR spectrum of the acryl copolymer was observed in FIG. 3 means that a weak spectrum of the acryl copolymer was observed in the fluoropolymer coating layer due to the diffusion effect of a primer even though the multi-layered film was formed by coating the primer layer including an acryl copolymer and the fluoropolymer coating layer not including an acryl copolymer in Examples 1 and 2. That is, the fact that the primer was diffused to a depth of approximately at least 5 μm from the fluoropolymer coating layer can be confirmed through the ATR FTIR spectrum.

In addition, through the spectra of Examples 1 and 2, it can be confirmed that the diffusion effect of the primer was controlled by changing a thickness of the fluoropolymer coating layer on the primer layer having the same thickness. That is, it can be confirmed that, in Example 1 in which the fluoropolymer coating layer has a large thickness, a ratio of the primer present on a surface of the fluoropolymer coating layer was smaller than that in Example 2 in which the fluoropolymer coating layer had a relatively small thickness. Accordingly, it can be confirmed that as the thickness of the fluoropolymer coating layer was smaller, the ratio of the primer present on the surface of the fluoropolymer coating layer, that is, traveling by diffusion, was increased.

Experimental Example 3

Figure 5:
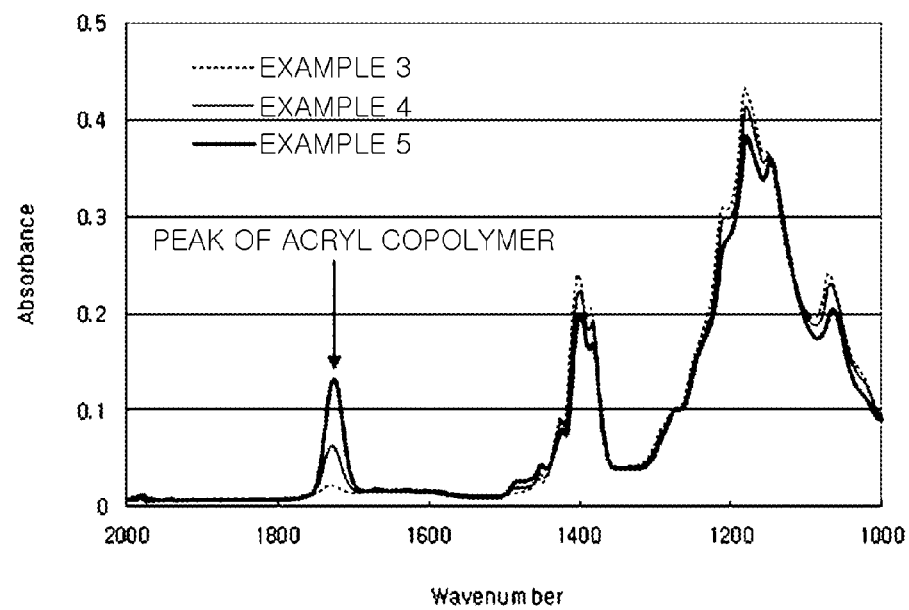
FIG. 5 shows ATR FTIR spectra for multi-layered films of Examples 3 to 5.
Figure 5:
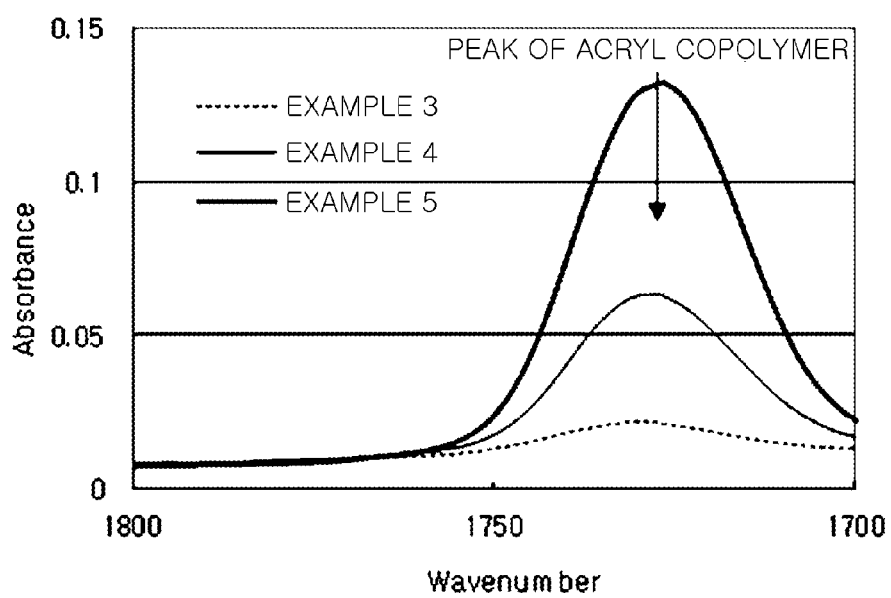

FIG. 5 shows ATR FTIR spectra of the multi-layered films of Examples 3 to 5, measured on a surface of a fluoropolymer coating layer.

Referring to FIG. 5, it can be confirmed that, in the multi-layered films according to Examples 3 to 5 of the present application, the IR spectrum of an acryl copolymer was also observed on a surface of the fluoropolymer coating layer in a wavelength of approximately 1700 to 1750, which was not observed in FIG. 4. In addition, through the spectra of Examples 3 to 5, it can be confirmed that though the fluoropolymer coating layers had the same thickness, a gradational diffusion effect of the primers was capable of being controlled by changing thicknesses of the primer layers. That is, it can be confirmed that a ratio of the primer present on a surface of the fluoropolymer coating layer in Example 3 in which the primer layer had a smaller thickness was smaller than that in Example 5 in which the primer layer had a relatively larger thickness. Accordingly, it can be confirmed that as the primer layer had a larger thickness, the ratio of the primer present on the surface of the fluoropolymer coating layer was increased.

Examples 6 to 8

A multi-layered film was formed by the method as described in Example 4, except that an acryl copolymer having a ratio of methylmethacrylate:glycidylmethacrylate:butylacrylate of 40:40:20 and a weight average molecular weight of 53,000, 26,000 or 8,000 was used as a primer instead of the acryl copolymer used in Example 4.

Comparative Examples 4 to 6

Multi-layered films were formed by the method as described in Comparative Example 3, except that the acryl copolymers used in the fluoropolymer coating solutions were replaced with the acryl copolymers of Examples 6 to 8, respectively.

Comparative Examples 7 to 9

A multi-layered film was formed by the method as described in Example 1, except that a styrene-butadiene-styrene block copolymer (LG chemical, LG411), a polyvinylacetate (PVA) resin (Sekisui, KS5Z), or carboxyl-terminated acrylonitrile butadiene rubber (Nippon zeon, Nipol 1072), instead of the acryl copolymer and the oxazoline curing agent used in Example 1, was diluted in methylethylketone to have a solid content of 20% in the preparation of a primer coating solution, and thus a primer layer was formed to a thickness of 1.4 μm.

Experimental Example 4

The 180 degree peel strength and cross-hatch tests were performed on the multi-layered films in Examples 6 to 8 and Comparative Examples 4 and 9 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Tables 4 to 6.

TABLE 4

| Category | | Example 6 | Example 7 | Example 8 |
|---|---|---|---|---|
| Fluorine Layer | (P(VDF-CTFE)) | 70 g | 70 g | 70 g |
| | (P(VDF-HFP)) | 30 g | 30 g | 30 g |
| | TS62000 | 60 g | 60 g | 60 g |
| | Thickness (μm) | 20 | 20 | 20 |
| Primer Layer | Acryl Copolymer:WS-500 | 9:2.5 | 9:2.5 | 9:2.5 |
| | Acryl Copolymer Molecular Weight (Mw) | 53,000 | 26,000 | 8,000 |
| | Thickness (μm) | 1.4 | 1.4 | 1.4 |
| Cross-Hatch Test Results | 0 h | 5B | 5B | 5B |
| | 25 h | 5B | 5B | 5B |
| | 50 h | 5B | 5B | 5B |
| | 75 h | 5B | 5B | 5B |
| 180 Degree Peel Strength(N/cm) | 0 h | Coat-T | Coat-T | Coat-T |
| | 25 h | Coat-T | Coat-T | Coat-T |
| | 50 h | Coat-T | Coat-T | Coat-T |
| | 75 h | Coat-T | Coat-T | Coat-T |

Coat-T: measurement of exact peel strength was impossible because the fluoropolymer coating layer was torn during peeling

TABLE 5

| Category | | Comparative Example 4 | Comparative Example 5 | Comparative Example 6 |
|---|---|---|---|---|
| Fluorine Layer | (P(VDF-CTFE)) | 70 g | 70 g | 70 g |
| | (P(VDF-HFP)) | 30 g | 30 g | 30 g |
| | TS62000 | 60 g | 60 g | 60 g |
| | Acryl Copolymer (molecular weight Mw) | 3.6 g (53,000) | 3.6 g (26,000) | 3.6 g (8,000) |
| | WS-500 | 1 g | 1 g | 1 g |
| | Thickness(μm) | 20 | 20 | 20 |
| Cross-Hatch Test Results | 0 h | 0B | 0B | 0B |
| | 25 h | 0B | 0B | 0B |
| | 50 h | 0B | 0B | 0B |
| | 75 h | 0B | 0B | 0B |
| 180 Degree Peel Strength(N/cm) | 0 h | 0 | 0 | 0 |
| | 25 h | 0 | 0 | 0 |
| | 50 h | 0 | 0 | 0 |
| | 75 h | 0 | 0 | 0 |

TABLE 6

| Category | | Comparative Example 7 | Comparative Example 8 | Comparative Example 9 |
|---|---|---|---|---|
| Fluorine Layer | (P(VDF-CTFE)) | 70 g | 70 g | 70 g |
| | (P(VDF-HFP)) | 30 g | 30 g | 30 g |
| | TS62000 | 60 g | 60 g | 60 g |
| | Thickness (μm) | 20 | 20 | 20 |
| primer layer | Primer | LG411 | KS5Z | Nipol 1072 |
| | WS-500 | — | — | — |
| | Thickness (μm) | 1.4 | 1.4 | 1.4 |
| Cross-Hatch Test Results | 0 h | 0B | 0B | 0B |
| | 25 h | 0B | 0B | 0B |
| | 50 h | 0B | 0B | 0B |
| | 75 h | 0B | 0B | 0B |
| 180 Degree Peel Strength (N/cm) | 0 h | 0 | 0 | 0 |
| | 25 h | 0 | 0 | 0 |
| | 50 h | 0 | 0 | 0 |
| | 75 h | 0 | 0 | 0 |

As shown in Tables 4 and 5, it can be confirmed that in Examples 6 to 8 including the primer layer, though the primers having different molecular weights were used, favorable adhesive strengths were obtained, but in Comparative Examples 4 to 6 in which the acryl copolymer and the curing agent used in the primer coating solution were added to the fluoropolymer coating solution without a separate primer layer, sufficient interface adhesive strengths were not obtained.

In addition, as shown in Table 6, it can be confirmed that in Comparative Examples 7 to 9 including the primer layer having an incompatibility with the fluoropolymer, the diffusion between the fluoropolymer and the primer were not generated, and thus a sufficient interface adhesive strength was not obtained.

Experimental Example 5

Figure 6:
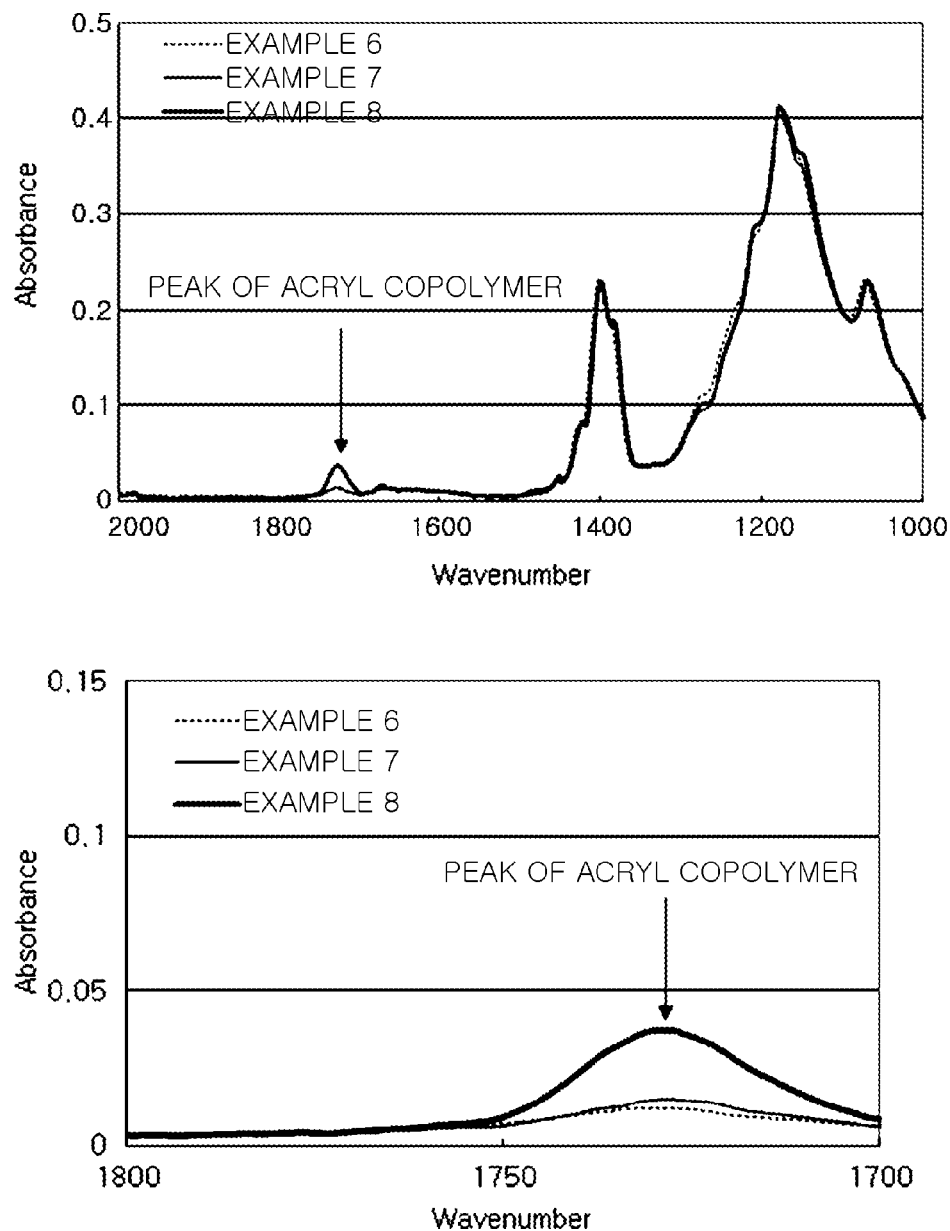
FIG. 6 shows ATR FTIR spectra for multi-layered films of Examples 6 to 8.
Figure 7:
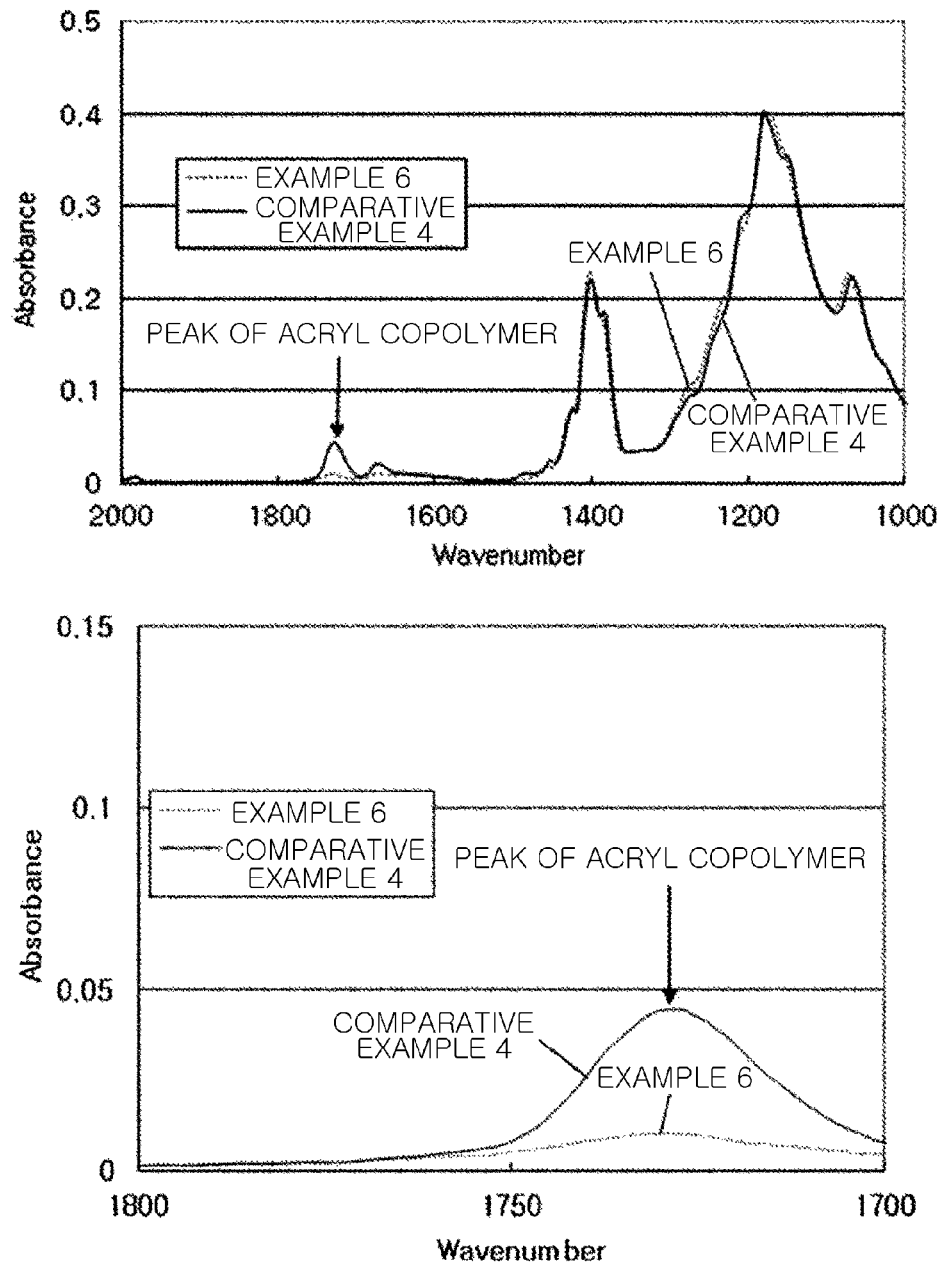
FIG. 7 shows the comparison of ATR FTIR spectra between multi-layered films of Example 6 and Comparative Example 4.
Figure 8:
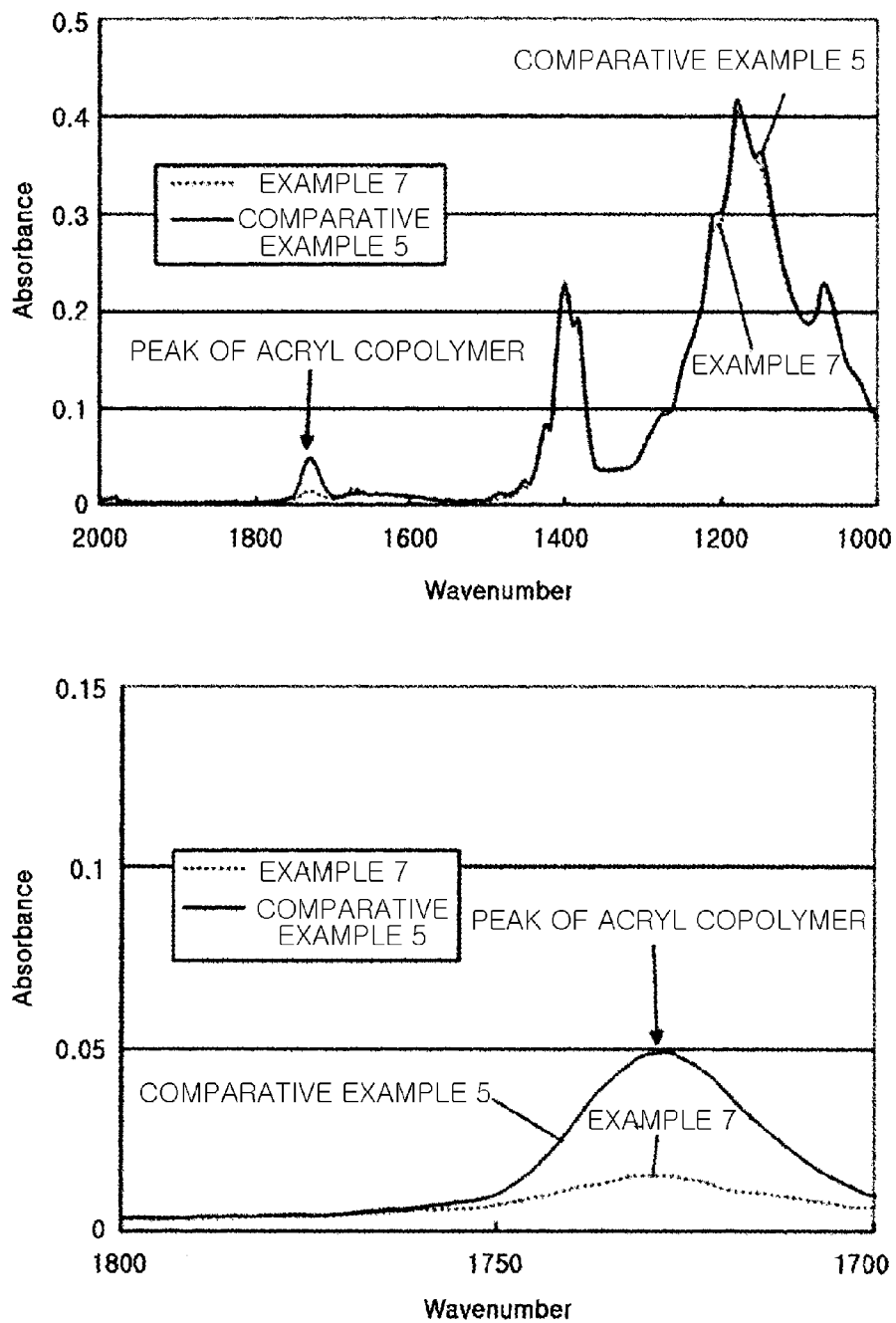
FIG. 8 shows the comparison of ATR FTIR spectra between multi-layered films of Example 7 and Comparative Example 5.
Figure 9:
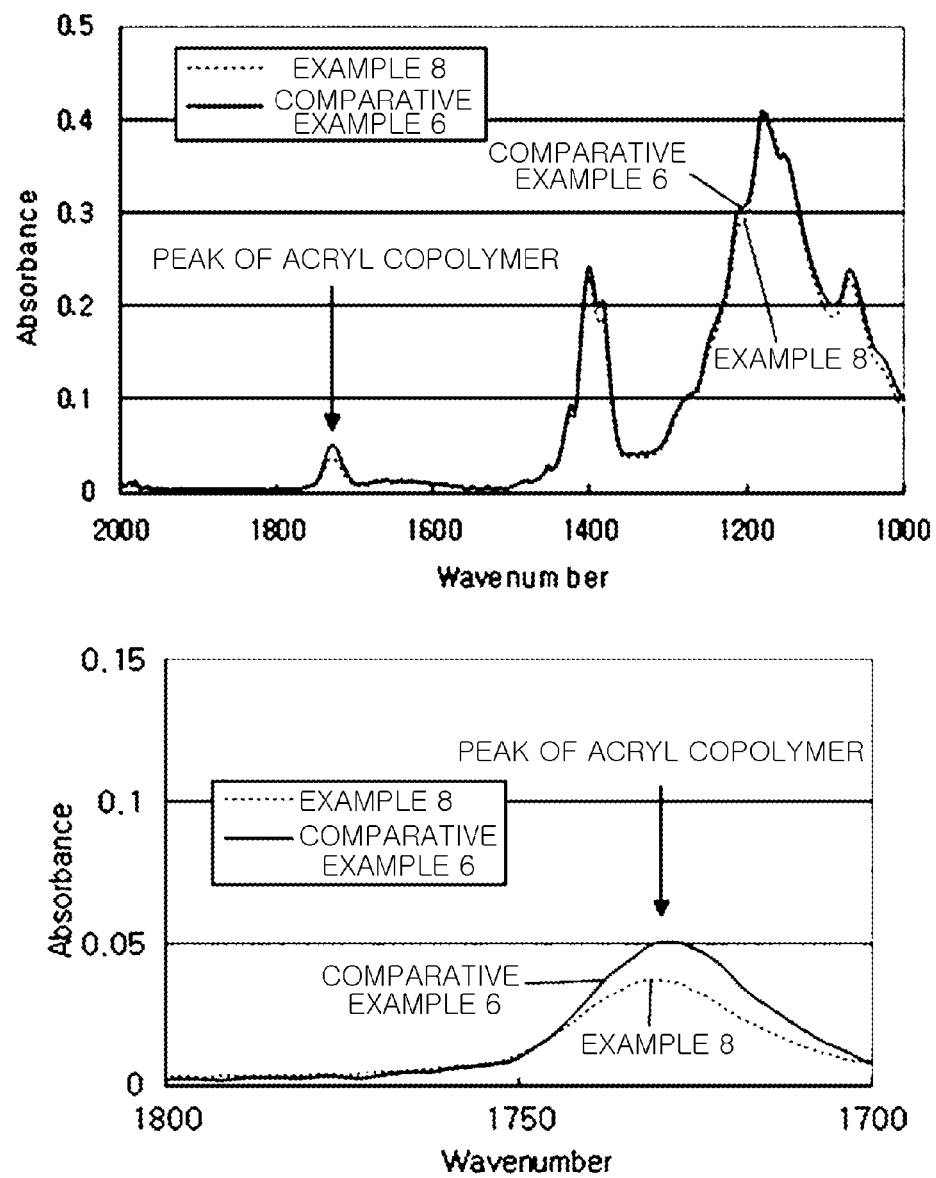
FIG. 9 shows the comparison of ATR FTIR spectra between multi-layered films of Example 8 and Comparative Example 6.

FIG. 6 shows ATR FTIR spectra of the multi-layered films of Examples 6 to 8, measured on a surface of the fluoropolymer coating layer. In addition, FIGS. 7 to 9 show ATR FTIR spectra of the multi-layered films of Comparative Examples 4 to 6 in comparison to Examples 6 to 8. Moreover, FIGS. 10 to 12 show ATR FTIR spectra of the multi-layered films of Comparative Examples 7 to 9.

Referring to FIG. 6, it can be confirmed that as the molecular weight of the primer was decreased, the diffusion effect of the primer was more increased. Therefore, it can be seen that the gradational diffusion effect of the primer could be controlled by the control in molecular weight of the primer.

In addition, referring to FIGS. 7 to 9, comparing Example and Comparative Example to which the same amounts of acryl copolymers were applied to the primer layer and the fluoropolymer coating layer, respectively, it can be confirmed that the ratio of acryl present on the surface of the fluoropolymer coating layer in Example including the primer layer was lower than that in Comparative Example including the acryl copolymer as the compatibilizer in the fluoropolymer coating layer. That is, it can be seen that, according to Example in which the fluoropolymer and the primer were separately coated, the ratio of the acryl copolymer present on the surface of the fluoropolymer coating layer could be reduced due to gradation of the acryl copolymer, which was the primer material, in the fluoropolymer coating layer, thereby further enhancing the weather resistance of the multi-layered film, compared to Comparative Example using the mixture of the fluoropolymer and the acryl copolymer.

Figure 10:
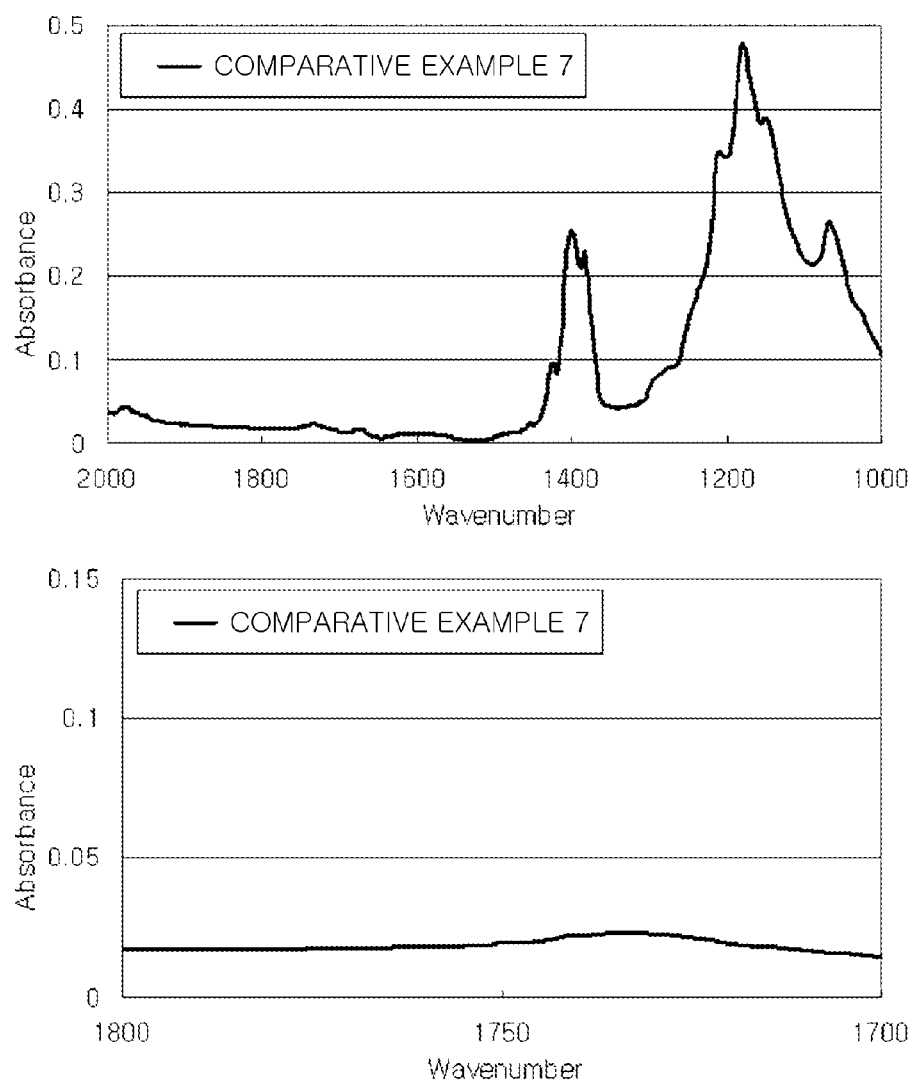
FIGS. 10 to 12 are ATR FTIR spectra for multi-layered films of Comparative Examples 7 to 9.
Figure 11:
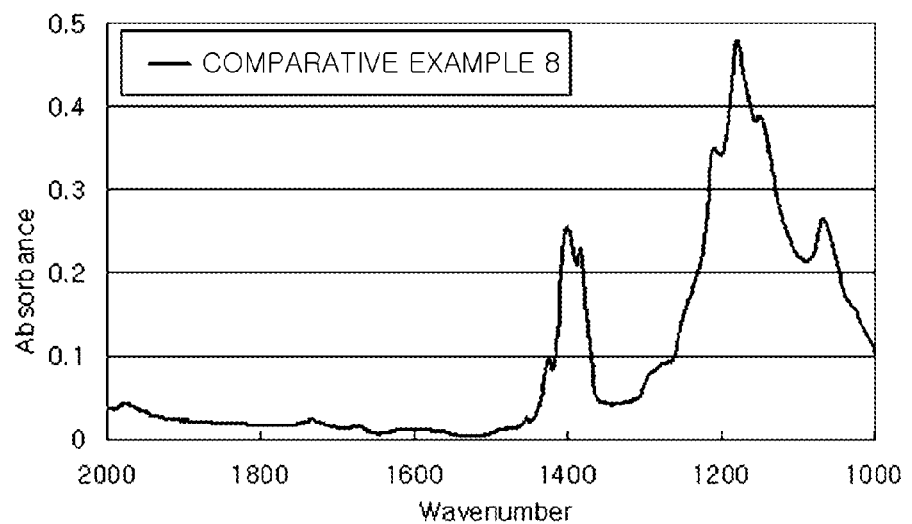
Figure 11:
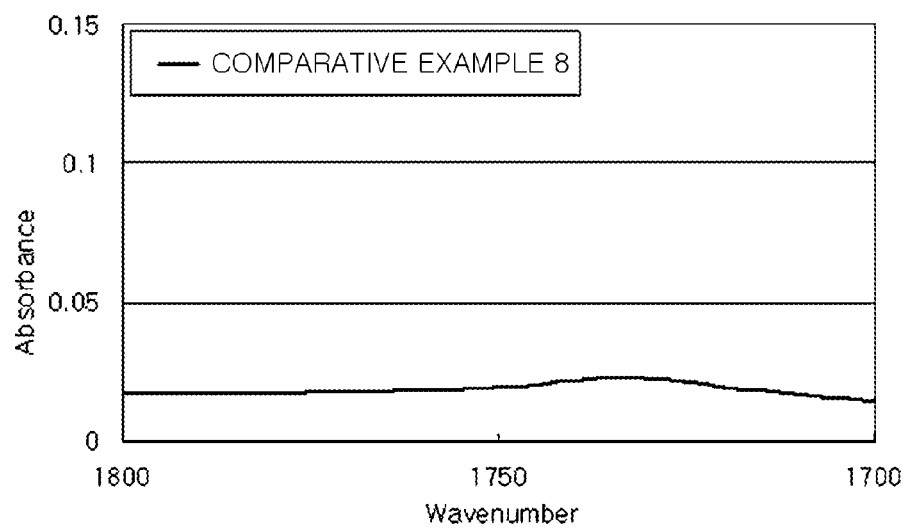
Figure 12:
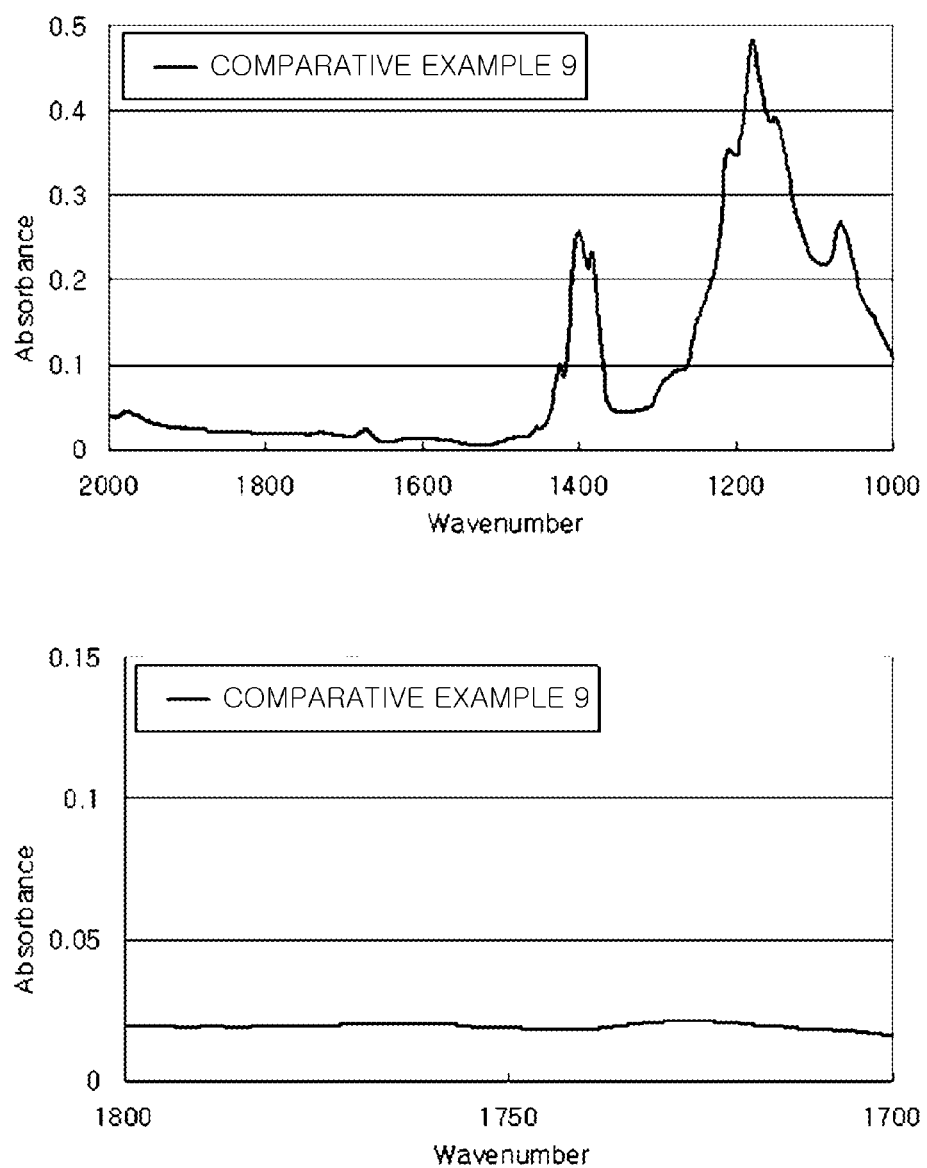

Referring to FIGS. 10 to 12, it can be confirmed that, like Comparative Examples 7 to 9, when the primer layer having incompatibility with the fluoropolymer was included, the peak of the acryl copolymer was not observed, and it can be seen that the inter-diffusion effect between the fluoropolymer and the incompatible primer layer did not occur.

Experimental Example 6

Figure 13:
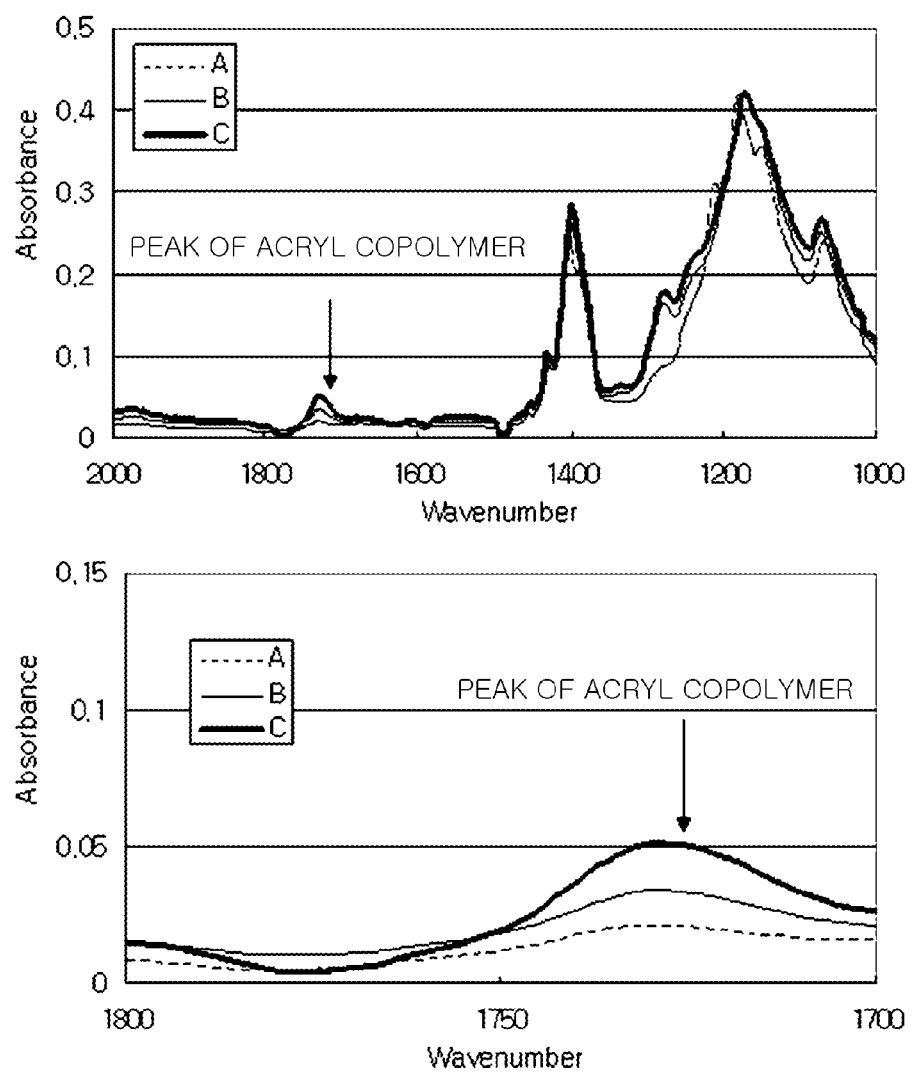
FIG. 13 shows the comparison of ATR FTIR spectra between a surface layer, a middle layer and an inner layer of a fluoropolymer coating layer of the multi-layered film of Example 7.

FIG. 13 shows ATR FTIR spectra of a surface layer, middle layer and an inner layer of the fluoropolymer coating layer of the multi-layered film of Example 7. Here, the ATR FTIR measurement was performed by measuring an ATR FTIR of the surface layer of the fluoropolymer coating layer, measuring an ATR FTIR of the middle layer after peeling a part of the surface layer, and measuring an ATR FTIR of the inner layer after peeling more of the surface layer. In FIG. 13, the surface layer of the fluoropolymer coating layer is referred to A, the middle layer is referred to B, and the inner layer close to the primer layer is referred to C.

Referring to FIG. 13, it can be confirmed that the content of the acryl copolymer was increased inside the fluoropolymer coating layer from the surface of the fluoropolymer coating layer to the substrate. That is, it can be seen that the content of fluorine having excellent weather resistance was increased in the surface of the fluoropolymer coating layer, and the content of the acryl copolymer having an excellent adhesive strength was increased in the substrate. Therefore, it can be confirmed that, according to the method of the present application, a multi-layered film showing a gradational diffusion effect of the primer, which is the ideal type of the diffusion effect as described above, can be provided.

Example 9

A multi-layered film was formed by the same method as described in Example 3, except that a non-reactive acryl copolymer, Pararoid B44 produced by Rohm & Hass, was used as a primer.

Comparative Example 10

A multi-layered film was formed by the same method as described in Comparative Example 3, except that Pararoid B44 produced by Rohm & Hass used in Example 9 was used instead of the acryl copolymer used in the fluoropolymer coating solution.

Experimental Example 11

The 180 degree peel strength and cross-hatch tests were performed on the multi-layered films formed in Example 9 and Comparative Example 10 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Tables 7 and 8.

TABLE 7

| Category | | Example 9 |
|---|---|---|
| Fluorine Layer | (P(VDF-CTFE)) | 70 g |
| | (P(VDF-HFP)) | 30 g |
| | TS62000 | 60 g |
| | Thickness (μm) | 20 |
| primer layer | Acryl Copolymer:WS-500 | 9:2.5 |
| | Thickness (μm) | 1.4 |
| Cross-Hatch Test Results | 0 h | 5B |
| | 25 h | 5B |
| | 50 h | 5B |
| | 75 h | 5B |
| 180 Degree Peel Strength (N/cm) | 0 h | Coat-T |
| | 25 h | Coat-T |
| | 50 h | Coat-T |
| | 75 h | Coat-T |

Coat-T: measurement of exact peel strength was impossible because the fluoropolymer coating layer was torn during peeling

TABLE 8

| Category | | Comparative Example 10 |
|---|---|---|
| Fluorine Layer | (P(VDF-CTFE)) | 70 g |
| | (P(VDF-HFP)) | 30 g |
| | TS62000 | 60 g |
| | Acryl Copolymer | 3.6 g |
| | WS-500 | 1 g |
| | Thickness (μm) | 20 |
| Cross-Hatch Test Results | 0 h | 0B |
| | 25 h | 0B |
| | 50 h | 0B |
| | 75 h | 0B |
| 180 Degree Peel Strength (N/cm) | 0 h | 0 |
| | 25 h | 0 |
| | 50 h | 0 |
| | 75 h | 0 |

As shown in Tables 7 and 8, it can be confirmed that even when the non-reactive acryl copolymer was used as a primer, a favorable interface adhesive strength was also shown, but when the non-reactive acryl copolymer was included in the fluoropolymer coating layer, not in the primer layer, an interface adhesive strength was not obtained.

Example 10

A multi-layered film was formed by the method as described in Example 1. Accordingly, a primer was prepared by the method described in Example 1, but 50 g of glycidylmethacrylate and 34 g of hydroxymethacrylate were used in the preparation of a primer, and instead of oxazoline, isocyanate (DN980S, Aekyung Chemical Co., Ltd.) was diluted in methylethylketone in a ratio of acryl copolymer: isocyanate=1:1 as a curing agent.

Comparative Example 11

A multi-layered film was formed by the method as described in Comparative Example 3, except that the acryl copolymer and the curing agent used in Example 10 were used instead of those used in the fluoropolymer coating solution.

Experimental Example 8

The 180 degree peel strength and cross-hatch tests were performed on the multi-layered films formed in Example 10 and Comparative Example 11 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Tables 9 and 10.

TABLE 9

| Category | | Example 10 |
|---|---|---|
| Fluorine Layer | (P(VDF-CTFE)) | 70 g |
| | (P(VDF-HFP)) | 30 g |
| | TS62000 | 60 g |
| | Thickness (μm) | 20 |
| primer layer | Acryl Copolymer: DN980S | 5:5 |
| | Thickness (μm) | 1.4 |
| Cross-Hatch Test Results | 0 h | 5B |
| | 25 h | 5B |
| | 50 h | 5B |
| | 75 h | 5B |
| 180 Degree Peel Strength (N/cm) | 0 h | Coat-T |
| | 25 h | Coat-T |
| | 50 h | Coat-T |
| | 75 h | Coat-T |

Coat-T: measurement of exact peel strength was impossible because the fluoropolymer coating layer was torn during peeling

TABLE 10

| Category | | Comparative Example 11 |
|---|---|---|
| Fluorine Layer | (P(VDF-CTFE)) | 70 g |
| | (P(VDF-HFP)) | 30 g |
| | TS62000 | 60 g |
| | Acryl Copolymer | 2 g |
| | DN980S | 2 g |
| | Thickness (μm) | 20 |
| Cross-Hatch Test Results | 0 h | 0B |
| | 25 h | 0B |
| | 50 h | 0B |
| | 75 h | 0B |
| 180 Degree Peel Strength (N/cm) | 0 h | 0 |
| | 25 h | 0 |
| | 50 h | 0 |
| | 75 h | 0 |

As shown in Tables 9 and 10, it can be confirmed that even when the primer layer was formed by adding the isocyanate curing agent instead of the oxazoline curing agent, a favorable interface adhesive strength was also shown, but when the isocyanate curing agent was included in the fluoropolymer coating layer, not in the primer layer, an interface adhesive strength was not obtained.

Examples 11 to 14

A multi-layered film was formed by the method as described in Example 1, except that, instead of the primer coating solution used in Example 1, an acryl copolymer (WS-500) having an oxazoline group was dissolved in water to have various solid contents of 20, 10, 5 and 1%.

Example 15

A multi-layered film was formed by the method as described in Example 11, except that, instead of the acryl copolymer (WS-500) having an oxazoline group used in Example 11, an isocyanate compound, DN980S, was used as a primer.

Experimental Example 9

The 180 degree peel strength and cross-hatch tests were performed on the multi-layered films formed in Examples 11 to 15 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Table 11.

TABLE 11

| Category | | Example 11 | Example 12 | Example 13 | Example 14 | Example 15 |
|---|---|---|---|---|---|---|
| Fluorine Layer | (P(VDF-CTFE)) | 70 g | 70 g | 70 g | 70 g | 70 g |
| | (P(VDF-HFP)) | 30 g | 30 g | 30 g | 30 g | 30 g |
| | TS62000 | 60 g | 60 g | 60 g | 60 g | 60 g |
| | Thickness (μm) | 20 | 20 | 20 | 20 | 20 |
| Primer Layer | Primer | WS-500 | WS-500 | WS-500 | WS-500 | DN980S |
| | Thickness (μm) | 1.4 | 0.7 | 0.3 | 0.07 | 1.4 |
| Cross-Hatch Test Results | 0 h | 5B | 5B | 5B | 5B | 5B |
| | 25 h | 5B | 5B | 5B | 5B | 5B |
| | 50 h | 5B | 5B | 5B | 5B | 5B |
| | 75 h | 5B | 5B | 5B | 5B | 5B |
| 180 Degree Peel Strength (N/cm) | 0 h | Coat-T | Coat-T | Coat-T | Coat-T | Coat-T |
| | 25 h | Coat-T | Coat-T | Coat-T | Coat-T | Coat-T |
| | 50 h | Coat-T | Coat-T | Coat-T | Coat-T | Coat-T |
| | 75 h | Coat-T | Coat-T | Coat-T | Coat-T | Coat-T |

Coat-T: measurement of exact peel strength was impossible because the fluoropolymer coating layer was torn during peeling As shown in Table 11, it can be confirmed that even when the primer layer was formed without separating a curing agent and a primer, the favorable interface adhesive strength was also shown.

Examples 16 to 18

A multi-layered film was formed by the method as described in Example 1, except that SG82L treated with an aqueous acryl primer was used as a substrate instead of the polyester film, Skyrol SG00L, and a primer layer was formed by diluting the acryl copolymer prepared in Example 1 in methylethylketone to have a solid content of 20, 10 or 5% in the preparation of a primer coating solution.

Experimental Example 10

The 180 degree peel strength and cross-hatch tests were performed on the multi-layered films formed in Examples 16 to 18 after the PCT was performed. In detail, each of the multi-layered films was left for 25, 50 or 75 hours under conditions of 2 atm, 121° C. and 100% R.H., and subjected to the 180 degree peel strength and cross-hatch tests to evaluate the change in peel strength. Evaluation results are listed in Table 12.

TABLE 12

| Category | | Example 16 | Example 17 | Example 18 |
|---|---|---|---|---|
| Fluorine Layer | (P(VDF-CTFE)) | 70 g | 70 g | 70 g |
| | (P(VDF-HFP)) | 30 g | 30 g | 30 g |
| | TS62000 | 60 g | 60 g | 60 g |
| | Thickness (μm) | 20 | 20 | 20 |
| Primer Layer | Primer | Acryl Copolymer | Acryl Copolymer | Acryl Copolymer |
| | Thickness (μm) | 1.4 | 0.7 | 0.3 |
| Cross-Hatch Test Results | 0 h | 5B | 5B | 5B |
| | 25 h | 5B | 5B | 5B |
| | 50 h | 5B | 5B | 5B |
| | 75 h | 5B | 5B | 5B |
| 180 Degree Peel Strength (N/cm) | 0 h | Coat-T | Coat-T | Coat-T |
| | 25 h | Coat-T | Coat-T | Coat-T |
| | 50 h | Coat-T | Coat-T | Coat-T |
| | 75 h | Coat-T | Coat-T | Coat-T |

As shown in Table 12, it can be confirmed that the multi-layered film having a structure formed by coating a compatible primer layer on the aqueous acryl primer layer previously formed on the substrate also obtained a favorable interface adhesive strength.

That is, according to Examples 1 to 18, Comparative Examples 1 to 8 and the corresponding Experimental Examples, it could be confirmed that when the fluoropolymer coating layer was formed after the primer layer was coated, an excellent interface adhesive strength and better durability were obtained than when the fluoropolymer coating layer was formed by adding a compatible material to the fluoropolymer coating solution without the primer layer. In addition, it could be confirmed that when the primer layer including a primer having an incompatibility with the fluoropolymer was included, the interface adhesive strength was decreased, compared to when a compatible primer was used.

The above-described results were caused by the diffusion effect of inducing the gradation of a material between the primer layer and the fluoropolymer coating layer. From these facts, it could be seen that the multi-layered film having a primer layer having compatibility with a fluoropolymer could simultaneously achieve an adhesive strength and durability, and a degree of the gradational diffusion of a primer could be controlled by changing a thickness of the primer layer, a thickness of the fluoropolymer coating layer, a molecular weight of the primer, a kind of the primer, and a solvent.

A multi-layered film according to an exemplary embodiment of the present application includes a primer layer and a fluoropolymer coating layer. Gradation of materials is created by inter-diffusion of materials between the layers, and thus a primer ratio is increased as the primer layer gets close to the substrate, and a fluorine ratio is increased as the primer layer gets close to a surface of the fluoropolymer coating layer. As a result, the multi-layered film can have excellent weather resistance and adhesive strength. In addition, the multi-layered film can be formed at a low drying temperature and a low cost using a low-boiling-point solvent, increase productivity, and prevent degradation of quality of the product, which is caused by thermal transformation or heat shock. The multi-layered film as described above is used in a backsheet for a photovoltaic cell, and thus can provide a photovoltaic module having excellent durability even when exposed to an external environment for a long time.

While the invention has been shown and described with reference to certain exemplary embodiments thereof, it will be understood by those skilled in the art that various changes in form and details may be made therein without departing from the scope of the invention as defined by the appended claims.

What is claimed is:

1. A multi-layered film, comprising:
   a substrate; and
   a fluoropolymer coating layer including a fluoropolymer; and
   a primer layer, including a primer having a main chain backbone having compatibility with the fluoropolymer and a functional group enhancing adhesive strength to the fluoropolymer coating layer through a dipole-dipole interaction by C—$F_2$ bonding of the fluoropolymer, between the substrate and the fluoropolymer coating layer,
   wherein the fluoropolymer coating layer is formed by coating a composition including the fluoropolymer that does not include a compatibilizer having compatibility with the fluoropolymer, on the primer layer, and
   wherein the fluoropolymer coating layer has a gradation in which a concentration of the primer increases toward a surface close to the primer layer, and a concentration of the fluoropolymer increases toward a surface opposite to the primer layer.

2. The film according to claim 1, wherein the main chain backbone is at least one selected from the group consisting of a (meth)acryl-based main chain backbone; a urethane-based main chain backbone; an ether sulfone-based main chain backbone; an ether imine-based main chain backbone; an amide-based main chain backbone; a polyester-based main chain backbone; an aliphatic polyester-based main chain backbone; a polyester urethane-based main chain backbone; a (meth)acrylamide-based main chain backbone; a urea-based main chain backbone; a polycarbonate-based main chain backbone; and a main chain backbone of a free radical addition polymer induced from a monomer mixture including a (meth)acryl-based monomer, a (meth)acrylamide-based monomer or a vinyl-based monomer as a main component.

3. The film according to claim 1, wherein the functional group is at least one selected from the group consisting of a carboxyl group, a sulfonic acid group, an aziridine group, an acid anhydride group, an amine group, an isocyanate group, a cyanuramide group, an epoxy group, a hydroxyl group, an ester functional group, a carbamate functional group, an amide group, a urea group, an imide group, a phosphate group, a phosphoric acid group, an oxazoline group, a cyano group, a cyanate group and an imine group.

4. The film according to claim 1, wherein the primer layer further includes a curing agent.

5. The film according to claim 1, wherein the primer layer has a thickness of 10 to 5,000 nm.

6. The film according to claim 1, wherein the fluoropolymer coating layer has a non-crystalline region, and includes a fluoropolymer having a degree of crystallinity of less than 60%.

7. The film according to claim 1, wherein the fluoropolymer includes a monopolymer, copolymer or a mixture thereof, which includes at least one monomer selected from the group consisting of vinylidene fluoride (VDF), vinyl fluoride (VF), tetrafluoroethylene (TFE) hexafluoropropylene (HFP), chlorotrifluoroethylene (CTFE), trifluoroethylene, hexafluoroisobutylene, perfluoro butylethylene, perfluoro(methylvinylether) (PMVE), perfluoro (ethylvinylether) (PEVE), perfluoro(propylvinylether) (PPVE), perfluoro(hexylvinylether) (PHVE), perfluoro-2,2-dimethyl-1,3-dioxole (PDD), and perfluoro-2-methylene-4-methyl-1,3-dioxolane (PMD) in a polymerized form.

8. The film according to claim 1, wherein the fluoropolymer is a monopolymer or copolymer including vinyl fluoride in a polymerized form, or a monomer or copolymer including vinylidene fluoride in a polymerized form.

9. The film according to claim 1, wherein the fluoropolymer is polyvinylidene fluoride (PVDF) including at least one comonomer selected from the group consisting of hexafluoropropylene (HFP), chlorotrifluoroethylene (CTFE), tetrafluoroethylene (TFE), trifluoroethylene, hexafluoroisobutylene, perfluorobutylethylene, perfluoro (methylvinylether) (PMVE), perfluoro(hexylvinylether) (PHVE), perfluoro-2,2-dimethyl-1,3-dioxole (PDD) and perfluoro-2-methylene-4-methyl-1,3-dioxolane (PMD) in a polymerized form.

10. The film according to claim 1, wherein the fluoropolymer has a weight average molecular weight of 50,000 to 1,000,000.

11. The film according to claim 1, wherein the fluoropolymer has a melting point of 80 to 175° C.

12. The film according to claim 9, wherein the comonomer is included in a content of 0.5 to 50 wt % of a total copolymer.

13. The film according to claim 1, wherein the fluoropolymer coating layer further includes at least one selected from the group consisting of a pigment, a filler, a UV stabilizer, a thermal stabilizer, a dispersing agent and a barrier particle.

14. The film according to claim 1, wherein the fluoropolymer coating layer has a thickness of 3 to 50 μm.

15. The film according to claim 1, wherein the substrate includes aluminum, iron, or a mono sheet, stacked sheet or co-extrusion product of polyethylene terephthalate (PET), polyethylene naphthalate (PEN) or polybutylene terephthalate (PBT).

16. The film according to claim 1, wherein at least one surface treatment selected from the group consisting of treatments with plasma, a corona, a primer, an anchor agent and a coupling agent, and heat treatment is performed on at least one surface of the substrate.

17. The film according to claim 1, wherein the substrate has a thickness of 50 to 500 μm.

18. A method of forming the multi-layered film of claim 1 having an enhanced adhesive strength due to diffusion between a primer layer and a fluoropolymer after the primer layer and the fluoropolymer are coated, the method comprising:
  forming a primer layer by coating a primer coating solution having compatibility with a fluoropolymer on a substrate; and
  coating a composition for coating a fluoropolymer not including a compatibilizer on the primer layer.

19. The method according to claim 18, wherein the composition for coating a fluoropolymer has a non-crystalline region, and includes a fluoropolymer having a degree of crystallinity of less than 60% and a solvent having a boiling point of 200° C. or less.

20. The method according to claim 19, wherein the solvent having a boiling point of 200° C. or less includes at least one selected from the group consisting of acetone, methylethylketone, dimethylformamide and dimethylacetamide.

21. The method according to claim 18, wherein the primer includes a main chain backbone having compatibility with a fluoropolymer and a functional group.

22. The method according to claim 18, wherein the primer coating solution further includes a curing agent.

23. The method according to claim 22, wherein the curing agent is at least one selected from the group consisting of a melamine compound, an oxazoline compound, an isocyanate compound, an aziridine compound, an amine compound and an amide compound.

24. The method according to claim 18, further comprising:
  drying each layer after the primer layer and the fluoropolymer are coated.

25. The method according to claim 24, wherein the drying is performed at a temperature of 200° C. or less for 30 seconds to 30 minutes.

26. The method according to claim 18, further comprising:
  performing treatment with plasma, a corona, a primer, an anchor agent, a coupling agent or heat on at least one surface of the substrate.

27. A backsheet for a photovoltaic cell comprising the multi-layered film according to claim 1.

28. A photovoltaic module comprising the backsheet for a photovoltaic cell according to claim 27.

* * * * *